(12) United States Patent
Robinett et al.

(10) Patent No.: US 7,872,502 B2
(45) Date of Patent: Jan. 18, 2011

(54) DEFECT-AND-FAILURE-TOLERANT DEMULTIPLEXER USING SERIES REPLICATION AND ERROR-CONTROL ENCODING

(75) Inventors: Warren Robinett, Chapel Hill, NC (US); Philip J. Kuekes, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1224 days.

(21) Appl. No.: 11/484,961

(22) Filed: Jul. 12, 2006

(65) Prior Publication Data

US 2008/0013393 A1    Jan. 17, 2008

(51) Int. Cl.
*H03K 19/094* (2006.01)
(52) U.S. Cl. .......................................... 326/105; 326/14
(58) Field of Classification Search ................ 326/9, 326/10, 13, 14, 105–108
See application file for complete search history.

(56) References Cited

U.S. PATENT DOCUMENTS

| 4,368,523 | A | * | 1/1983 | Kawate | ........................ | 365/63 |
| 6,060,941 | A |  | 5/2000 | Brownlow | | |
| 7,580,026 | B2 | * | 8/2009 | Liu | ............................ | 345/107 |
| 2004/0051395 | A1 | | 3/2004 | Brindle | | |
| 2005/0055387 | A1 | | 3/2005 | Kuekes et al. | | |

FOREIGN PATENT DOCUMENTS

| EP | 0431846 | 6/1991 |
| EP | 0604170 | 6/1994 |

OTHER PUBLICATIONS

EPO Examination Report, EP Application No. 07796813.9 issued by European Patent Office Sep. 21, 2010.
European Search Report, Application No. EP10156022.5-2215, dated Apr. 8, 2010.

* cited by examiner

*Primary Examiner*—Don P Le

(57) ABSTRACT

One embodiment of the present invention is a method for constructing defect-and-failure-tolerant demultiplexers. This method is applicable to nanoscale, microscale, or larger-scale demultiplexer circuits. Demultiplexer circuits can be viewed as a set of AND gates, each including a reversibly switchable interconnection between a number of address lines, or address-line-derived signal lines, and an output signal line. Each reversibly switchable interconnection includes one or more reversibly switchable elements. In certain demultiplexer embodiments, NMOS and/or PMOS transistors are employed as reversibly switchable elements. In the method that represents one embodiment of the present invention, two or more serially connected transistors are employed in each reversibly switchable interconnection, so that short defects in up to one less than the number of serially interconnected transistors does not lead to failure of the reversibly switchable interconnection. In addition, error-control-encoding techniques are used to introduce additional address-line-derived signal lines and additional switchable interconnections so that the demultiplexer may function even when a number of individual, switchable interconnections are open-defective.

14 Claims, 22 Drawing Sheets

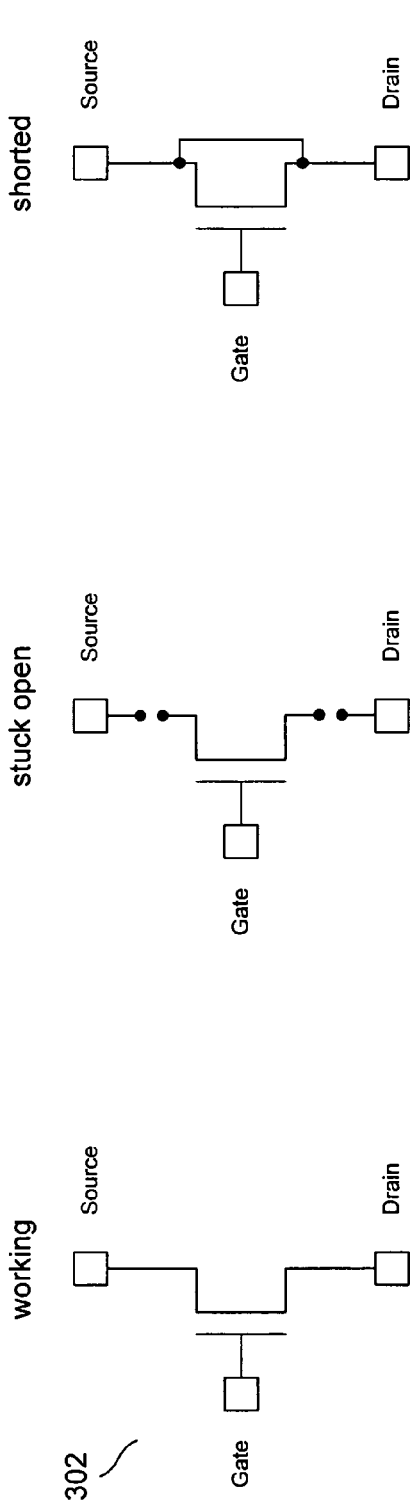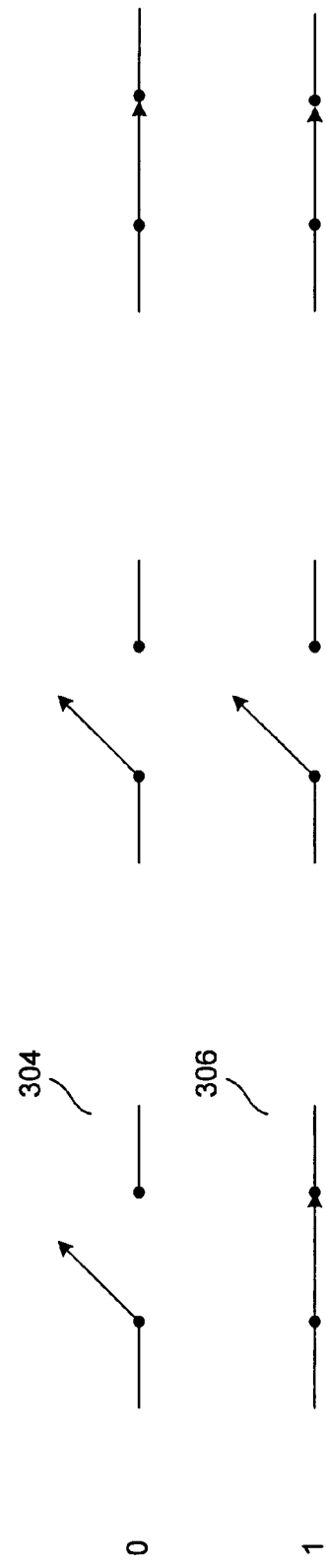
*Figure 3A* *Figure 3B* *Figure 3C*

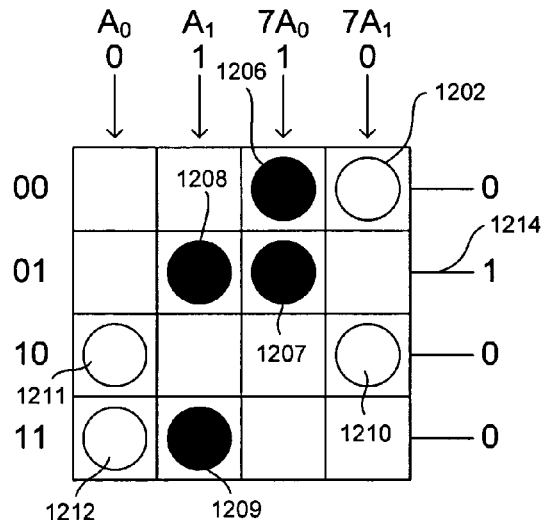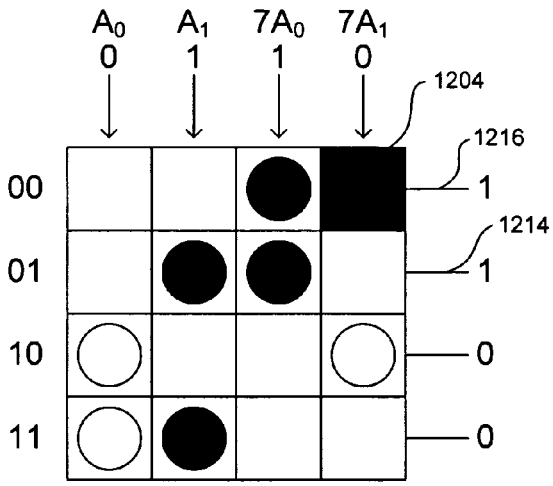
*Figure 12A*  *Figure 12B*
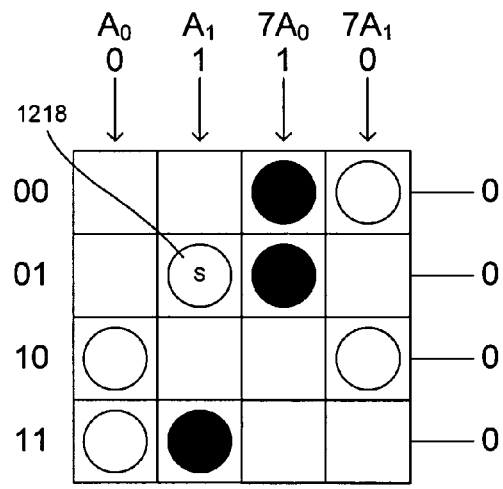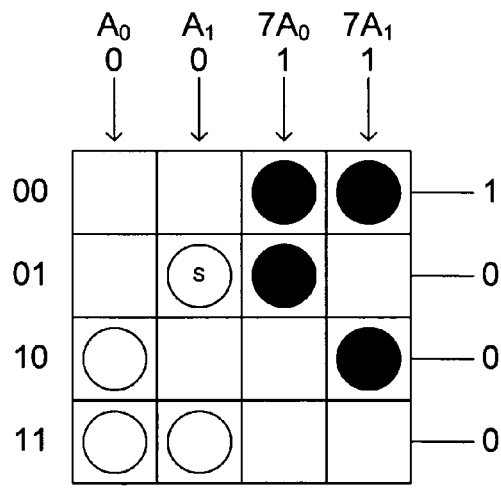
*Figure 12C*  *Figure 12D*

DEFECT-AND-FAILURE-TOLERANT DEMULTIPLEXER USING SERIES REPLICATION AND ERROR-CONTROL ENCODING

TECHNICAL FIELD

The present invention is related to defect-and-failure-tolerant circuitry, integrated circuits, and electronic devices and, in particular, to a method for employing series replication of transistors and error-control-coding-based signal-line redundancies to produce defect-and-failure-tolerant demultiplexers.

BACKGROUND OF THE INVENTION

The spectacular decrease in the size of electronic circuits and circuit components, including transistors, made possible by continuous advances in photolithography and other integrated-circuit fabrication technologies, and the ever decreasing per-component cost of manufacturing transistors and integrated circuits has lead to the development of increasingly complex and densely patterned integrated circuits and electronic devices. For example, the development of near-nanoscale integrated-circuit manufacturing techniques has provided the basis for development of the complex and extremely high-speed processors that drive modern computers and processor-controlled electronic devices, including personal computers, home-entertainment systems, and a wide variety of processor-controlled machinery and electrical systems used in airplanes, automobiles, machine tools, medical instruments, scientific instruments, and a host of other products and systems. The ability to economically and reliably manufacture dense, large-scale arrays of transistors has led, for example, to the development and commercialization of thin-film transistor LCD monitors and TV screens.

However, as electrical circuitry grows increasingly smaller and is more densely fabricated, manufacturing errors often become more difficult to control. Even the presence of a tiny speck of dust or a submicroscale misalignment of a photolithography mask during manufacturing processes can lead to manufacturing defects in many tens to hundreds of submicroscale electronic components, including transistors and transistor-based logic gates. The accumulation of such defects quickly leads to defective circuits and devices and to precipitously decreasing yields of operational devices produced by currently employed manufacturing processes. For this reason, and because the scale at which electronic-circuit components can be fabricated is being pushed increasingly smaller by emerging technologies, further exacerbating problems associated manufacturing defects, significant research and development efforts are being applied to developing defect tolerance within electrical circuits, integrated circuits, and electronic devices. Many of these techniques are equally applicable to failures in electronic-circuit components that arise after manufacture.

Many approaches to defect tolerance and failure tolerance rely on incorporating redundant components in circuits, devices, and systems, so that if a single component of a set of multiple, redundant components fails, the remaining, operational components within the set of multiple, redundant components may continue to provide a desired functionality. Redundancies may be employed at large-scale component levels, at the level of modules within electronic circuits and integrated circuits, and at smaller levels. However, incorporating redundancy within circuits and devices may increase manufacturing costs, power consumption, and, at times, increase the complexity of a system, thereby introducing opportunities for new types of failures and manufacturing defects. For example, while four-engine airplanes may intuitively seem to be inherently more safe than two-engine airplanes, failure analysis has shown, in certain cases, that the increased complexity of control and monitoring systems in four-engine airplanes may actually more than offset safety gains from the two redundant engines. For this reason, designers and manufacturers of electrical circuits, integrated circuits, and electronic devices are continually seeking new methods and approaches for increasing defect tolerance and failure tolerance of electrical circuits, integrated circuits, and electronic devices without unnecessarily increasing the complexity of the circuits and devices, without unnecessarily increasing manufacturing costs and power consumption of the circuits and devices, and without creating new modes and opportunities for defects and failures that would offset gains obtained by the defect-and-failure-tolerant methods and approaches.

SUMMARY OF THE INVENTION

One embodiment of the present invention is a method for constructing defect-and-failure-tolerant demultiplexers. This method is applicable to nanoscale, microscale, or larger-scale demultiplexer circuits. Demultiplexer circuits can be viewed as a set of AND gates, each including a reversibly switchable interconnection between a number of address lines, or address-line-derived signal lines, and an output signal line. Each reversibly switchable interconnection includes one or more reversibly switchable elements. In certain demultiplexer embodiments, NMOS and/or PMOS transistors are employed as reversibly switchable elements. In a method that represents one embodiment of the present invention, two or more serially connected transistors are employed in each reversibly switchable interconnection, so that short defects in up to one less than the number of serially interconnected transistors do not lead to failure of the reversibly switchable interconnection. In addition, error-control-encoding techniques are used to introduce additional address-line-derived signal lines and additional switchable interconnections so that the demultiplexer may function even when a number of individual, switchable interconnections are open-defective. Additional embodiments of the present invention include demultiplexers that incorporate both serial redundancy of switchable elements within reversibly switchable interconnections and parallel redundancy of address-line-derived signal lines and reversibly switchable interconnections.

BRIEF DESCRIPTION OF THE DRAWINGS

FIGS. 3A-C illustrate two types of defects that may occur in an NMOS transistor.

FIGS. 12A-D illustrate the functional state of the PMOS-transistor-based demultiplexer shown in FIGS. 10-11 when all component PMOS transistors are functional and when certain of the component PMOS transistors are defective.

DETAILED DESCRIPTION OF THE INVENTION

Figure 1A:
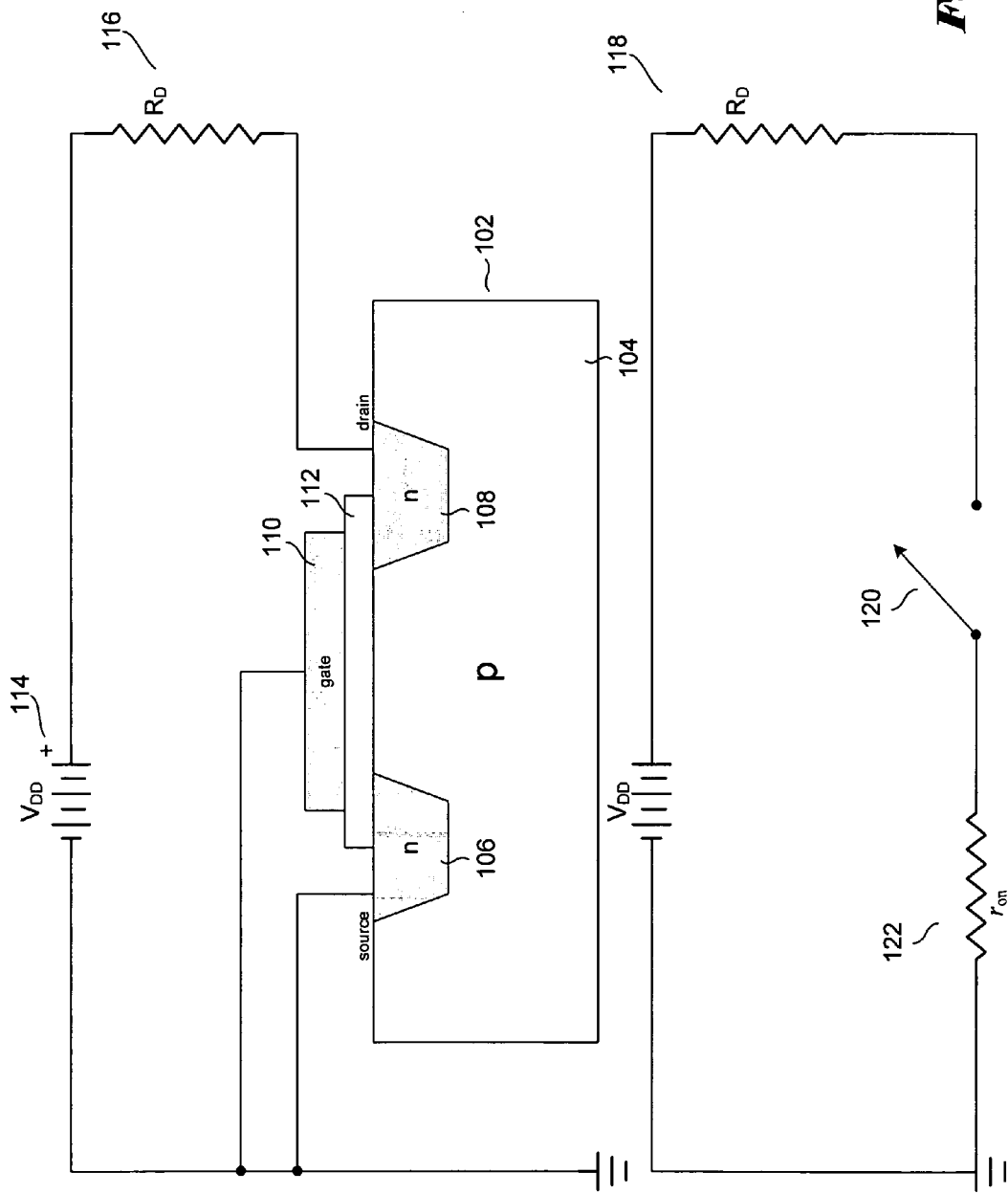
FIGS. 1A-B illustrate operation of an NMOS transistor used in a digital logic circuit.

The present invention is related to the design of circuits, including demultiplexer circuits, at the nanoscale, microscale, and larger-scale levels. An embodiment of the present invention provides a method for designing defect-and-failure-tolerant demultiplexers. Demultiplexers are used in many different applications for address-based accessing of signal lines and components. Additional embodiments of the present invention include various types of demultiplexer circuits and demultiplexer-based devices that incorporate serial switching-element redundancy and parallel address-line-derived signal-line redundancies in order to ameliorate short defects and open defects in reversibly switchable elements within reversibly switchable interconnects. The parallel redundancies are based on error-control-coding techniques developed for a variety of information storage and information transmission and reception applications. In a first subsection, below, an overview of error-control-coding techniques is provided. In a second subsection, embodiments of the present invention are discussed.

Error-Control-Coding Techniques

Embodiments of the present invention employ concepts derived from well-known techniques in error-control encoding. An excellent reference for this field is the textbook "Error Control Coding: The Fundamentals and Applications," Lin and Costello, Prentice-Hall, Incorporated, New Jersey, 1983. In this subsection, a brief description of the error-detection and error-correaction techniques used in error-control encoding is set forth. Additional details can be obtained from the above-referenced textbook, or from many other textbooks, papers, and journal articles in this field. The current subsection represents a rather mathematically precise, but concise, description of certain types of error-control encoding techniques. The current invention employs concepts inherent in these error-control encoding techniques for a different purpose. Error-control encoding techniques systematically introduce supplemental bits or symbols into plain-text messages, or encode plain-text messages using a greater number of bits or symbols than absolutely required, in order to provide information in encoded messages to allow for errors arising in storage or transmission to be detected and, in some cases, corrected. One effect of the supplemental or more-than-absolutely-needed bits or symbols is to increase the distance between valid codewords, when codewords are viewed as vectors in a vector space and the distance between codewords is a metric derived from the vector subtraction of the codewords. The current invention employs concepts used in error-control coding to add supplemental address-line-derived signal lines to increase the distance between valid addresses in order to correspondingly increase the signal separation, in the number of reversibly switchable interconnections needed to be properly set in order to address a signal line, and to thereby provide open-defect tolerance in a demultiplexer. Thus, in the current invention, the plain-text and encoded messages of error-control encoding are analogous to input addresses and coded addresses, and the additional or greater-number-than-needed symbols or bits in error-control encoding are analogous to supplemental or a greater-than-absolutely-needed number of address-line derived signal lines.

In describing error detection and correaction, it is useful to describe the data to be transmitted, stored, and retrieved as one or more messages, where a message $\mu$ comprises an ordered sequence of symbols, $\mu_i$, that are elements of a field F. A message $\mu$ can be expressed as:

$$\mu = (\mu_0, \mu_1, \ldots \mu_{k-1})$$

where, $\mu_i \in F$.

The field F is a set that is closed under multiplication and addition, and that includes multiplicative and additive inverses. It is common, in computational error detection and correaction, to employ fields comprising a subset of integers with sizes equal to a prime number, with the addition and multiplication operators defined as modulo addition and modulo multiplication. In practice, the binary field is commonly employed. Commonly, the original message is encoded into a message c that also comprises an ordered sequence of elements of the field F, expressed as follows:

$$c = (c_0, c_1, \ldots c_{n-1})$$

where $c_i \in F$.

Block encoding techniques encode data in blocks. In this discussion, a block can be viewed as a message $\mu$ comprising a fixed number of symbols k that is encoded into a message c comprising an ordered sequence of n symbols. The encoded message c generally contains a greater number of symbols than the original message $\mu$, and therefore n is greater than k. The r extra symbols in the encoded message, where r equals n−k, are used to carry redundant check information to allow for errors that arise during transmission, storage, and retrieval to be detected with an extremely high probability of detection and, in many cases, corrected.

In a linear block code, the $2^k$ codewords form a k-dimensional subspace of the vector space of all n-tuples over the field F. The Hamming weight of a codeword is the number of non-zero elements in the codeword, and the Hamming distance between two codewords is the number of elements in which the two codewords differ. For example, consider the following two codewords a and b, assuming elements from the binary field:

a=(1 0 0 1 1)
b=(1 0 0 0 1)

The codeword a has a Hamming weight of 3, the codeword b has a Hamming weight of 2, and the Hamming distance between codewords a and b is 1, since codewords a and b differ only in the fourth element. Linear block codes are often designated by a three-element tuple [n, k, d], where n is the codeword length, k is the message length, or, equivalently, the base-2 logarithm of the number of codewords, and d is the minimum Hamming distance between different codewords, equal to the minimal-Hamming-weight, non-zero codeword in the code.

The encoding of data for transmission, storage, and retrieval, and subsequent decoding of the encoded data, can be notationally described as follows, when no errors arise during the transmission, storage, and retrieval of the data:

$$\mu \to c(s) \to c(r) \to \mu$$

where c(s) is the encoded message prior to transmission, and c(r) is the initially retrieved or received, message. Thus, an initial message μ is encoded to produce encoded message c(s) which is then transmitted, stored, or transmitted and stored, and is then subsequently retrieved or received as initially received message c(r). When not corrupted, the initially received message c(r) is then decoded to produce the original message μ. As indicated above, when no errors arise, the originally encoded message c(s) is equal to the initially received message c(r), and the initially received message c(r) is straightforwardly decoded, without error correaction, to the original message μ.

When errors arise during the transmission, storage, or retrieval of an encoded message, message encoding and decoding can be expressed as follows:

$$\mu(s) \to c(s) \to c(r) \to \mu(r)$$

Thus, as stated above, the final message $\mu_r$ may or may not be equal to the initial message $\mu(s)$, depending on the fidelity of the error detection and error correaction techniques employed to encode the original message μ(s) and decode or reconstruct the initially received message c(r) to produce the final received message μ(r). Error detection is the process of determining that:

$$c(r) \neq c(s)$$

while error correaction is a process that reconstructs the initial, encoded message from a corrupted initially received message:

$$c(r) \to c(s)$$

The encoding process transforms messages, symbolized as μ, into encoded messages c. Alternatively, a messages μ can be considered to be a word comprising an ordered set of symbols from the alphabet consisting of elements of F, and the encoded messages c can be considered to be a codeword also comprising an ordered set of symbols from the alphabet of elements of F. A word μ can be any ordered combination of k symbols selected from the elements of F, while a codeword c is defined as an ordered sequence of n symbols selected from elements of F via the encoding process:

$$\{c : \mu \to c\}$$

Linear block encoding techniques encode words of length k by considering the word μ to be a vector in a k-dimensional vector space, and multiplying the vector μ by a generator matrix, as follows:

$$c = \mu \cdot G$$

Notationally expanding the symbols in the above equation produces either of the following alternative expressions:

$$(c_0, c_1, \ldots, c_{n-1}) = (\mu_0, \mu_1, \ldots, \mu_{k-1}) \begin{pmatrix} g_{00} & g_{01} & g_{02} & \cdots & g_{0,n-1} \\ \vdots & & \ddots & & \vdots \\ g_{k-1,0} & g_{k-1,1} & g_{k-1,2} & \cdots & g_{k-1,n-1} \end{pmatrix}$$

$$(c_0, c_1, \ldots, c_{n-1}) = (\mu_0, \mu_1, \ldots, \mu_{k-1}) \begin{pmatrix} g_0 \\ g_1 \\ \vdots \\ g_{k-1} \end{pmatrix}$$

where $g_i = (g_{i,0}, g_{i,1}, g_{i,2} \cdots g_{i,n-1})$.

The generator matrix G for a linear block code can have the form:

$$G_{k,n} = \begin{pmatrix} p_{0,0} & p_{0,1} & \cdots & p_{0,r-1} & 1 & 0 & 0 & \cdots & 0 \\ p_{1,0} & p_{1,1} & \cdots & p_{1,r-1} & 0 & 1 & 0 & \cdots & 0 \\ \vdots & \vdots & \cdots & & 0 & 0 & 1 & \cdots & 0 \\ \vdots & \vdots & \cdots & & \cdots & \cdots & \cdots & \cdots & \cdots \\ \vdots & \vdots & \cdots & & \cdots & \cdots & \cdots & \cdots & \cdots \\ p_{k-1,0} & p_{k-1,1} & \cdots & p_{k-1,r-1} & 0 & 0 & 0 & \cdots & 1 \end{pmatrix}$$

or, alternatively:

$$G_{k,n} = [P_{k,r} | I_{k,k}].$$

Thus, the generator matrix G can be placed into a form of a matrix P augmented with a k-by-k identity matrix $I_{k,k}$. A code generated by a generator in this form is referred to as a "systematic code." When this generator matrix is applied to a word μ, the resulting codeword c has the form:

$$c = (c_0, c_1, \ldots, c_{r-1}, \mu_0, \mu_1, \ldots, \mu_{k-1})$$

where $c_i = \mu_0 p_{0,i} + \mu_1 p_{1,i}, \ldots, \mu_{k-1} p_{k-1,i})$.

Note that, in this discussion, a convention is employed in which the check symbols precede the message symbols. An alternate convention, in which the check symbols follow the message symbols, may also be used, with the parity-check and identity submatrices within the generator matrix interposed to generate codewords conforming to the alternate convention. Thus, in a systematic linear block code, the codewords comprise r parity-check symbols $c_i$ followed by the symbols comprising the original word μ. When no errors arise, the original word, or message μ, occurs in clear-text form within, and is easily extracted from, the corresponding codeword. The parity-check symbols turn out to be linear combinations of the symbols of the original message, or word μ.

One form of a second, useful matrix is the parity-check matrix $H_{r,n}$, defined as:

$$H_{r,n} = [I_{r,r} | -P^T]$$

or, equivalently, $$H_{r,n} = \begin{pmatrix} 1 & 0 & 0 & \cdots & 0 & -p_{0,0} & -p_{1,0} & -p_{2,0} & \cdots & -p_{k-1,0} \\ 0 & 1 & 0 & \cdots & 0 & -p_{0,1} & -p_{1,1} & -p_{2,1} & \cdots & -p_{k-1,1} \\ 0 & 0 & 1 & \cdots & 0 & -p_{0,2} & -p_{1,2} & -p_{2,2} & \cdots & -p_{k-1,2} \\ \cdots & \cdots & \cdots & \cdots & \cdots & \cdots & \cdots & \cdots & \cdots \\ 0 & 0 & 0 & \cdots & 1 & -p_{0,r-1} & -p_{1,r-1} & -p_{0,r-1} & \cdots & -p_{k-1,r-1} \end{pmatrix}.$$

The parity-check matrix can be used for systematic error detection and error correaction. Error detection and correaction involves computing a syndrome S from an initially received or retrieved message c(r) as follows:

$$S = (s_0, s_1, \ldots, s_{r-1}) = c(r) \cdot H^T$$

where $H^T$ is the transpose of the parity-check matrix $H_{r,n}$ expressed as:

$$H^T = \begin{pmatrix} 1 & 0 & 0 & \cdots & 0 \\ 0 & 1 & 0 & \cdots & 0 \\ 0 & 0 & 1 & \cdots & 0 \\ \cdots & \cdots & \cdots & \cdots & 1 \\ -p_{0,0} & -p_{0,1} & -p_{0,2} & \cdots & -p_{0,r-1} \\ -p_{1,0} & -p_{0,1} & -p_{0,2} & \cdots & -p_{0,r-1} \\ -p_{2,0} & -p_{0,1} & -p_{0,2} & \cdots & -p_{0,r-1} \\ \cdots & \cdots & \cdots & \cdots & \cdots \\ -p_{k-1,0} & -p_{k-1,1} & -p_{k-1,2} & \cdots & -p_{k-1,r-1} \end{pmatrix}.$$

Note that, when a binary field is employed, x=−x, so the minus signs shown above in $H^T$ are generally not shown.

Hamming codes are linear codes created for error-correaction purposes. For any positive integer m greater than or equal to 3, there exists a Hamming code having a codeword length n, a message length k, number of parity-check symbols r, and minimum Hamming distance $d_{min}$ as follows:

$$n = 2^m - 1$$

$$k = 2^m - m - 1$$

$$r = n - k = m$$

$$d_{min} = 3$$

The parity-check matrix H for a Hamming Code can be expressed as:

$$H = [I_m | Q]$$

where $I_m$ is an m×m identity matrix and the submatrix Q comprises all $2^m - m - 1$ distinct columns which are m-tuples each having 2 or more non-zero elements. For example, for m=3, a parity-check matrix for a [7,4,3] linear block Hamming code is $$H = \begin{pmatrix} 1 & 0 & 0 & 0 & 1 & 1 & 1 \\ 0 & 1 & 0 & 1 & 1 & 1 & 0 \\ 0 & 0 & 1 & 1 & 0 & 1 & 1 \end{pmatrix}$$

A generator matrix for a Hamming code is given by:

$$G = [Q^T I_{2^m - m - 1}]$$

where $Q^T$ is the transpose of the submartix Q, and $I_{2^m-m-1}$ is a $(2^m-m-1) \times (2^m-m-1)$ identity matrix. By systematically deleting l columns from the parity-check matrix H, a parity-check matrix H' for a shortened Hamming code can generally be obtained, with:

$$n = 2^m - l - 1$$

$$k = 2^m - m - l - 1$$

$$r = n - k = m$$

$$d_{min} \geq 3$$

As will be discussed, below, one embodiment of the present invention involves employing the above-described error-control coding techniques to a very different problem space, in which, rather than generating codewords of length k+r from messages of length k, interconnections between 2(k+r) address lines and address-line-derived signal lines and $2^k$ output signal lines within a demultiplexer are generated using a [n, k, d] linear-block code so that each of the $2^k$ output signal lines can be uniquely addressed by a k-bit input address despite as many as d−1 open-defective interconnections to each output signal line. In other words, one embodiment of the present invention involves applying error-control coding techniques to demultiplexer design so that the demultiplexer is defect-and-failure tolerant to open-defective reversibly switchable interconnections.

Other types of codes are employed to increase the Hamming distance between codewords in various applications. Many of these alternative codes do not have the convenient properties of linear block codes, including easy generation using generator matrices, and the transparent, pass-through feature of linear block codes allowing for the encoded value to be directly read from the code word. For linear block codes, a plain-text message transfers directly to a codeword containing, in addition, parity-check symbols or bits. In other types of codes, the plain-text message is not directly readable in a corresponding codeword. In both cases, codewords contain a greater number of symbols or bits than absolutely needed to enumerate all valid messages to be encoded. In the case of linear block codes, the additional symbols or bits are parity-check symbols or bits that supplement the plain-text symbols or bits, while in the other types of codes, valid messages are distributed throughout a vector space of dimension equal to the codeword size. It should be noted that, in the following descriptions of the present invention, the term "supplemental address lines" refers to either parity-check address lines, analogous to parity-check symbols or bits in linear block codes, or to the greater-number-than-absolutely-needed address lines, analogous to the greater-number-than-needed symbols or bits in these other types of codes. However, these other codes may have different advantages that provide utility in different applications.

Combinatoric codes provide a straightforward approach to increasing the Hamming distance between codewords. To create a combinatoric code (also known as a "constant-weight code" or an "r-hot code"), one may select combinations of r bits having a fixed number of 1's from a total codeword space of n bits to produce $$C_r^n = \frac{n!}{r!(n-r)!}$$

codewords of length n. Of course, one can produce a symmetrical code with an identical number of codewords by choosing combinations of r bits having a fixed number of 0's from a total codeword space of n bits. For example, a combinatoric code including $$C_r^n = \frac{n!}{r!(n-r)!} = 165$$

codewords can be obtained by choosing all possible 11-bit codewords with exactly three bits having the value "1," the codewords provided in the following table:

It is somewhat more complex to encode messages into combinatoric codes, but the logic to do so may be straightforwardly constructed at the logic-circuit level. Combinatoric codes have a guaranteed minimum Hamming distance of 2, and may have significantly better average Hamming distance separations between codewords. For example, in the above $$\binom{11}{3}$$

code, the average Hamming distance between codewords is 4.39. Combinatoric codes also have an advantage in producing total signal distinguishability within relatively narrow ranges, since these codes have constant weights, where the weight is defined as the number of bits having the value "1."

Another, similar type of code, referred to as a "random" code, is obtained by choosing random codewords of fixed length. For example, one can choose a fixed-length, binary, n-bit codeword size, and select a sufficient number of random n-bit binary numbers in order to obtain a desired number of binary codewords $2^k$, where n>Ak. The greater the value of A, the greater the expected minimum Hamming distance between the codewords. When creating random codes, distance checking can be carried out to reject new codewords that have a Hamming distance less than a minimum value with respect to those codewords already selected, and random codewords having approximately equal numbers of "1" and "0" bits can be used in order to obtain an increased average Hamming distance and increased expected minimum Hamming distance.

TABLE 1

| | | | | | |
|---|---|---|---|---|---|
| 11100000000 | 11010000000 | 11001000000 | 11000100000 | 11000010000 | 11000001000 |
| 11000000100 | 11000000010 | 11000000001 | 10110000000 | 10101000000 | 10100100000 |
| 10100010000 | 10100001000 | 10100000100 | 10100000010 | 10100000001 | 10011000000 |
| 10010100000 | 10010010000 | 10010001000 | 10010000100 | 10010000010 | 10010000001 |
| 10001100000 | 10001010000 | 10001001000 | 10001000100 | 10001000010 | 10001000001 |
| 10000110000 | 10000101000 | 10000100100 | 10000100010 | 10000100001 | 10000011000 |
| 10000010100 | 10000010010 | 10000010001 | 10000001100 | 10000001010 | 10000001001 |
| 10000000110 | 10000000101 | 10000000011 | 01110000000 | 01101000000 | 01100100000 |
| 01100010000 | 01100001000 | 01100000100 | 01100000010 | 01100000001 | 01011000000 |
| 01010100000 | 01010010000 | 01010001000 | 01010000100 | 01010000010 | 01010000001 |
| 01001100000 | 01001010000 | 01001001000 | 01001000100 | 01001000010 | 01001000001 |
| 01000110000 | 01000101000 | 01000100100 | 01000100010 | 01000100001 | 01000011000 |
| 01000010100 | 01000010010 | 01000010001 | 01000001100 | 01000001010 | 01000001001 |
| 01000000110 | 01000000101 | 01000000011 | 00111000000 | 00110100000 | 00110010000 |
| 00110001000 | 00110000100 | 00110000010 | 00110000001 | 00101100000 | 00101010000 |
| 00101001000 | 00101000100 | 00101000010 | 00101000001 | 00100110000 | 00100101000 |
| 00100100100 | 00100100010 | 00100100001 | 00100011000 | 00100010100 | 00100010010 |
| 00100010001 | 00100001100 | 00100001010 | 00100001001 | 00100000110 | 00100000101 |
| 00100000011 | 00011100000 | 00011010000 | 00011001000 | 00011000100 | 00011000010 |
| 00011000001 | 00010110000 | 00010101000 | 00010100100 | 00010100010 | 00010100001 |
| 00010011000 | 00010010100 | 00010010010 | 00010010001 | 00010001100 | 00010001010 |
| 00010001001 | 00010000110 | 00010000101 | 00010000011 | 00001110000 | 00001101000 |
| 00001100100 | 00001100010 | 00001100001 | 00001011000 | 00001010100 | 00001010010 |
| 00001010001 | 00001001100 | 00001001010 | 00001001001 | 00001000110 | 00001000101 |
| 00001000011 | 00000111000 | 00000110100 | 00000110010 | 00000110001 | 00000101100 |
| 00000101010 | 00000101001 | 00000100110 | 00000100101 | 00000100011 | 00000011100 |
| 00000011010 | 00000011001 | 00000010110 | 00000010101 | 00000010011 | 00000001110 |
| 00000001101 | 00000001011 | 00000000111 | | | |

Yet another type of code that may be employed in the methods and systems of the present invention is a random linear code. In a random linear code, the generator matrix is randomly generated, under linearity constraints, rather than generated as the combination of a parity-check matrix generated from linear sums of information elements that represent parity-check sums, and an identity matrix. A random linear block code is generally not systematic, but linear.

In general, codes that may be employed in the methods and systems of the present invention may be systematic and linear, systematic and non-linear, non-systematic and linear, or non-systematic and non-linear. For example, if C is a code, and u is an arbitrary n-vector, then the coset C'=u+C={u+c:c∈C} is another code with the same distance properties, and hence with the same error correaction and defect tolerance capabilities. If C is linear, and u is non-zero, then C' is non-linear, technically, an affine space. The random codes are generally neither systematic nor linear. Although linear block codes have properties that are attractive in the applications to be discussed below, linear codes, systematic codes, and non-linear, non-systematic codes may also be employed in various embodiments of the present invention.

EMBODIMENTS OF THE PRESENT INVENTION

Figure 1B:
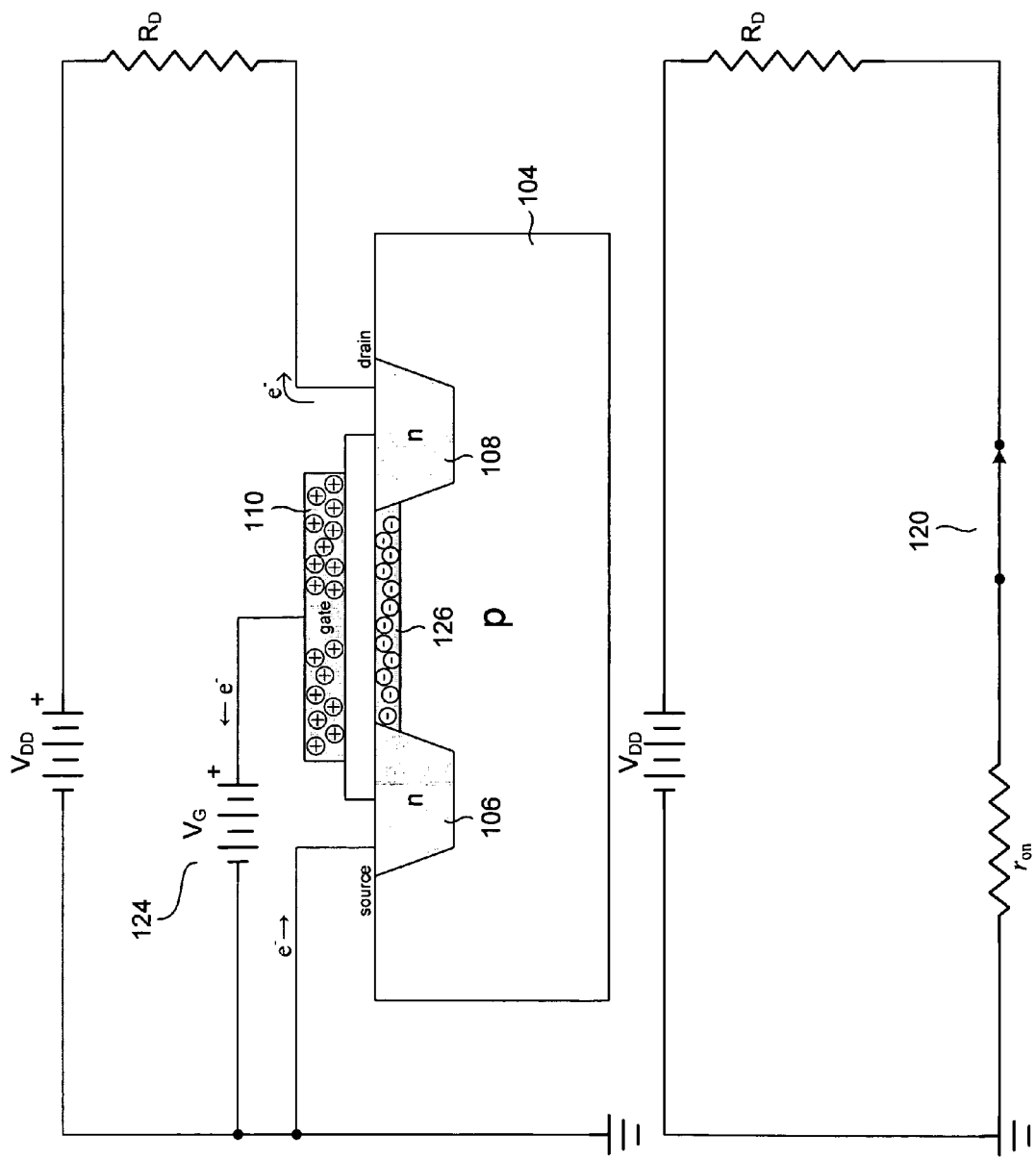

FIGS. 1A-B illustrate operation of an NMOS transistor used in a digital logic circuit. A transistor is used, in digital logic circuits, as a voltage-controlled or current-controlled switch that allows or prevents transmission of a voltage or current signal from a source input to a drain output. In FIG. 1A, the NMOS transistor 102 is schematically shown in cross section. The NMOS transistor comprises a p-doped silicon substrate 104 in which two highly n-doped channels 106 and 108 are fabricated. A conductive polysilicon gate 110 overlies a region of the p-doped silicon substrate between the two n-doped channels 106 and 108, separated from the p-doped silicon substrate by a thin, silicon-dioxide insulator layer 112. In FIG. 1A, a voltage $V_{DD}$ is applied 114 through a resistor 116 to the source and drain, with the source channel 106 held at the same voltage as the gate 110. Under these conditions, no current flows through the NMOS transistor. The circuit shown in the top portion of FIG. 1A, including the NMOS transistor 102, is shown as an electrical schematic diagram 118 in the lower portion of FIG. 1A. The NMOS transistor operates as an open switch 120 with a small internal resistance $r_{on}$ 122.

FIG. 1B illustrates application of a voltage to the gate of the NMOS transistor so that the NMOS transistor conducts current. FIG. 1B uses the same illustration conventions as used in FIG. 1A. When a voltage 124 is applied to the gate 110, as shown in FIG. 1B, electrons are withdrawn from the gate, leaving the gate with a cumulative positive charge. The cumulative positive charge within the gate attracts negative charges from the p-doped silicon substrate 104, which accumulate in a layer, or channel, 126 interconnecting the n-doped source channel 106 with the n-doped drain channel 108. This negatively charged channel 126 can carry current, thus completing the circuit and allowing current to flow from the source to the drain. An electrical schematic, in the lower portion of FIG. 1B, illustrates the circuit obtained when the NMOS transistor switch 120 is closed.

Figure 2:
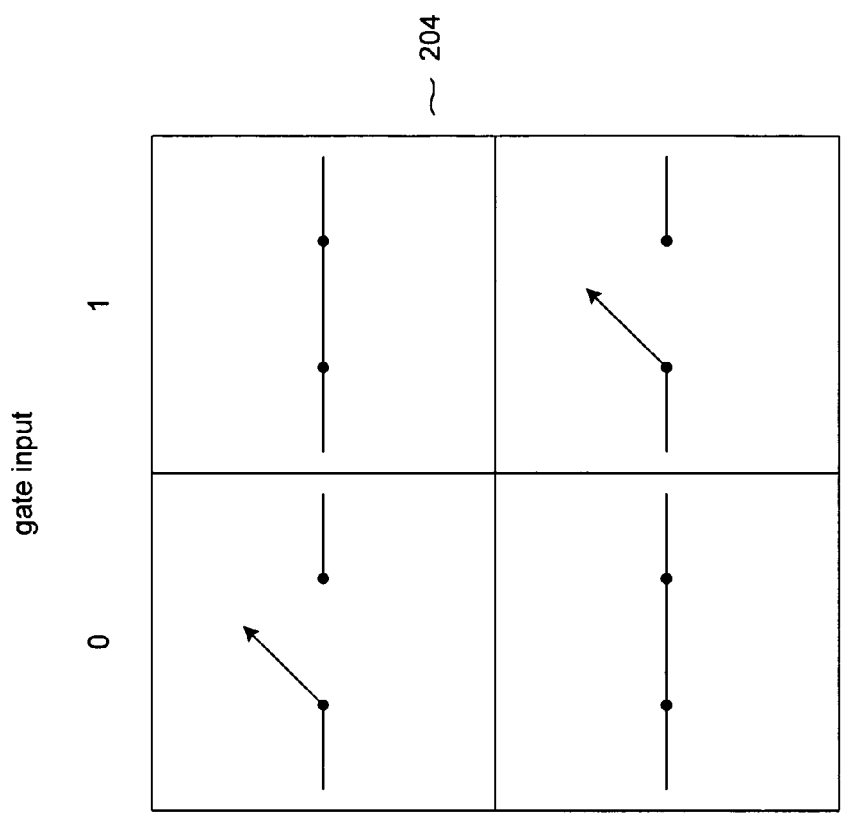
FIG. 2 illustrates operational characteristics of NMOS and PMOS transistors within digital logical circuits.

A variety of different types of transistors are employed in modern circuits and electronic devices, including the class of transistors referred to as metal-oxide-semiconductor field-effect transistors ("MOSFET"), which includes both NMOS and PMOS transistors. FIG. 2 illustrates operational characteristics of NMOS and PMOS transistors within digital logical circuits. An NMOS transistor, diagrammatically represented by schematic 202 in FIG. 2, is open when a "0" logic signal is applied to the gate, and closed when a "1" logic signal is applied to the gate, as indicated in the first row of the table 204 provided in FIG. 2. The logic signal "1" is often electronically represented by a positive voltage, and the logic signal "0" is often electronically represented as a ground or reference voltage, although alternative conventions may be used. A PMOS transistor, diagrammatically represented by the schematic 206 in FIG. 2, has an opposite switching convention, shown in the second row of the table 204 provided in FIG. 2.

Two types of defects frequently occur during manufacture of transistors, and subsequently arise as failures, during operation of transistors within circuits and devices. FIGS. 3A-C illustrate two types of defects that may occur in an NMOS transistor. As shown in FIG. 3A, a functional NMOS transistor 302 acts as an open switch when the logic signal "0" is applied to the gate 304, and as a closed switch when the logic signal "1" is applied to the gate 306. A stuck-open defect, or open defect, as illustrated in FIG. 3B, results in the NMOS transistor remaining in the open-switch state, regardless of the logic signal input to the gate. A short defect, as illustrated in FIG. 3C, results in the NMOS transistor remaining in the closed, conductive state regardless of the logic signal input to the gate. Open and short defects also occur in PMOS transistors and in other types of transistors.

Absent defect-and-failure tolerant provisions, open defects and short defects generally result in non-functional devices in which the defective transistors are incorporated. Even though the probability of an open defect or short defect occurring, during manufacture, can be controlled to be relatively low, the vast number of transistors employed in modern circuits, integrated circuits, and electronic devices result in significant probabilities of defectively manufactured circuits, integrated circuits, and electronic devices despite relatively low probabilities of defects in individual transistors. For this reason, a variety of techniques are employed to allow circuits, integrated circuits, and electronic devices to tolerate a certain number of defectively manufactured transistors and still operate in a desired fashion. As discussed above, many of these techniques rely on incorporating redundant modules, circuits, or larger components within devices and systems, so that a defect or failure in one of multiple redundant circuits, modules, or components, does not lead to overall device or system failure.

Figure 4B:
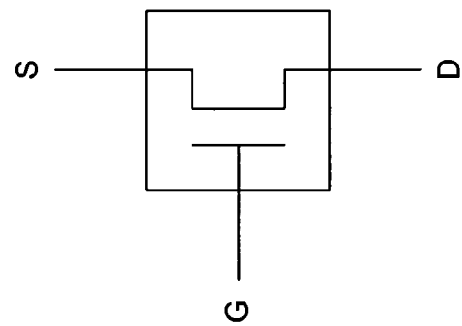
FIGS. 4A-B illustrate one technique for incorporating redundant transistors within circuits in order that the circuits survive defects or failures of individual transistors according to one embodiment of the present invention.
Figure 4A:
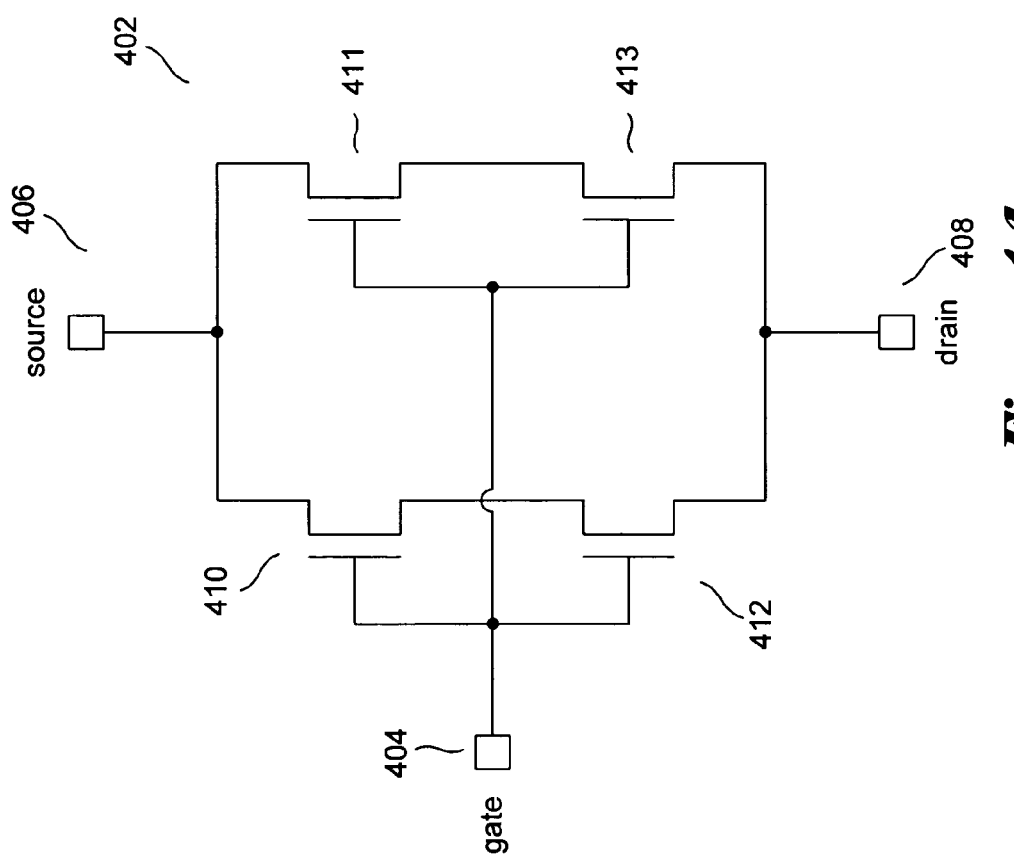

FIGS. 4A-B illustrate one technique for incorporating redundant transistors within circuits in order that the circuits survive defects or failures of individual transistors according to one embodiment of the present invention. FIG. 4A shows a compound NMOS transistor 402 with a gate 404, source 406, and drain 408. The compound transistor includes four simple NMOS transistors 410-413. The gates of the four simple transistors 410-413 are electronically connected to the gate 404 for the compound transistor, with two pairs of simple NMOS transistors (410, 412) and (411, 413), serially connected within two parallel circuit branches connecting the source 406 to the drain 408. FIG. 4B shows a schematic representation of the compound transistor. The compound transistor shown in FIGS. 4A-B is representative of a larger class of compound transistors, discussed below. Compound transistors of this larger class of compound transistors are referred to as "nS×mP compound transistors," "nS×mP transistors," or simply as "compound transistors." In the notation "nS×mP", n refers to the number of simple transistors connected in series in each parallel branch of the nS×mP transistor, and m refers to the number of parallel branches within the nS×mP transistor. The compound transistor shown in FIGS. 4A-B is, according to the above-described notation for compound transistors, a 2S×2P transistor.

Figure 5:
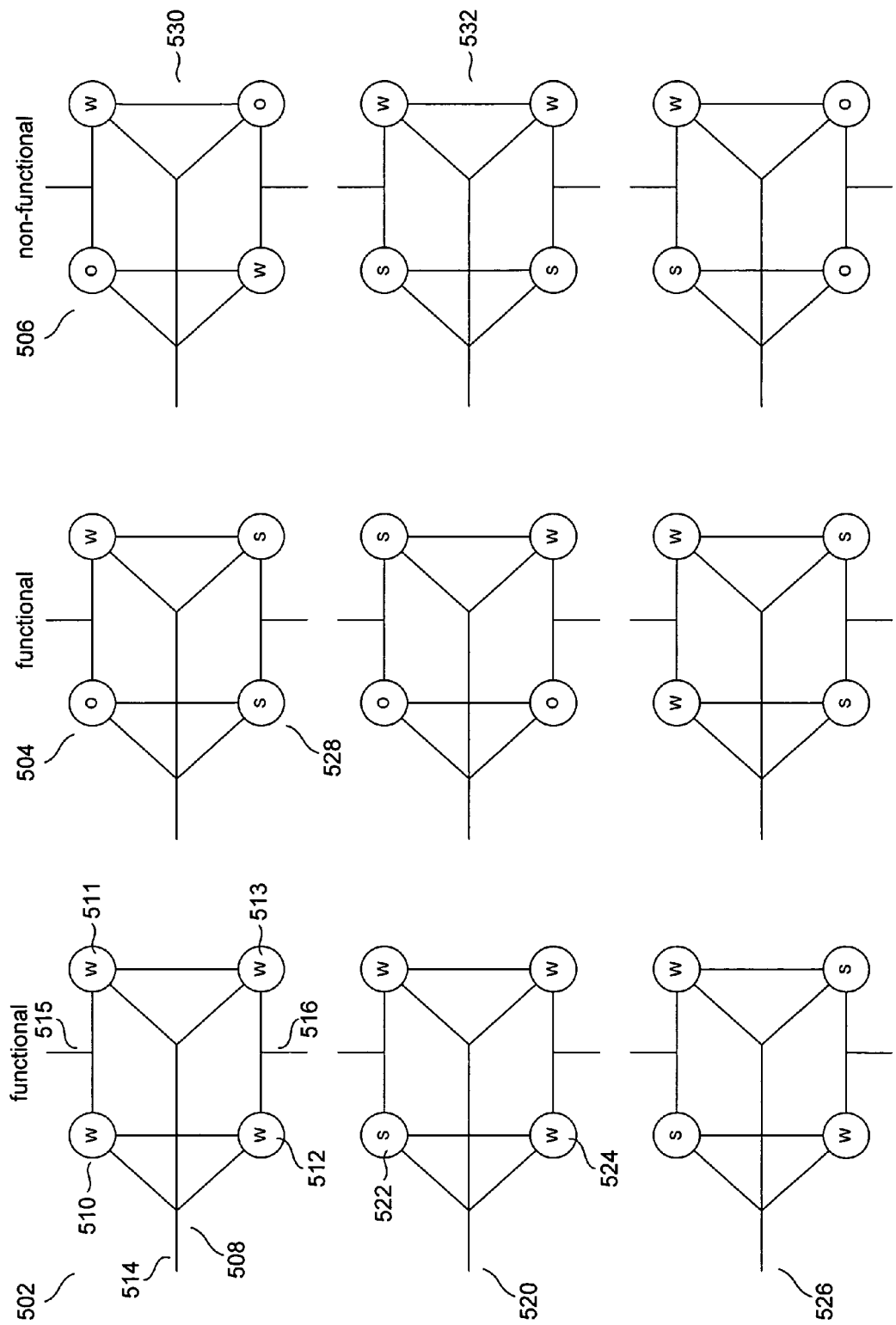
FIG. 5 illustrates certain combinations of working, open-defective, and short-defective individual transistors within a 2S×2P compound transistor that lead to functional and non-functional 2S×2P compound transistors according to one embodiment of the present invention.

A compound transistor can survive various combinations of short and open defects. FIG. 5 illustrates certain combinations of working, open-defective, and short-defective individual transistors within a 2S×2P compound transistor that lead to functional and nonfunctional 2S×2P compound transistors according to one embodiment of the present invention. In FIG. 5, two vertical columns 502 and 504 show functional 2S×2P compound transistors, and a third vertical column 506 shows examples of nonfunctional, 2S×2P compound transistors. Each compound-transistor functional state is represented, in FIG. 5, by a diagram, such as diagram 508, in which each simple transistor is represented by a circle 510-513 and in which the gate 514, source 515, and drain 516 are positioned corresponding to the positions of the gate, source, and drain in the schematic shown in FIG. 4A. The label "W" indicates a working, or functional, simple transistor, the label "O" indicates an open-defective simple transistor, and the label "S" indicates a short-defective simple transistor. When all four simple transistors are working, as shown in the functional-state diagram 508 in the first column 502 of FIG. 5, the 2S×2P compound transistor is functional. When a single simple transistor is short-defective, as shown in diagram 520, the compound transistor remains functional. The short-defective transistor 522 is compensated for by the working transistor 524 in the same branch as the short-defective simple transistor. When the working transistor 524 is open, no signal is transmitted through the branch, despite the short-defective transistor. As shown in the diagram 526, two short-defective simple transistors, one in each of the two parallel branches of the 2S×2P compound transistor, result in a functional 2S×2P compound transistor. In certain cases, as, for example, in the case represented by diagram 528 in FIG. 5, a 2S×2P compound transistor remains functional even when three of the four simple transistors are defective. However, in other cases, two or more defective simple transistors lead to nonfunctional 2S×2P compound transistors, examples of which are shown in the third column 506 in FIG. 5. For example, as shown in diagram 530, an open-defective transistor in each of the two branches of the compound transistor leads to a nonfunctional, open-defective 2S×2P compound transistor. As shown in diagram 532, two short-defective simple transistors within a single branch of the 2S×2P compound transistor lead to a short-defective compound transistor.

Figure 6:
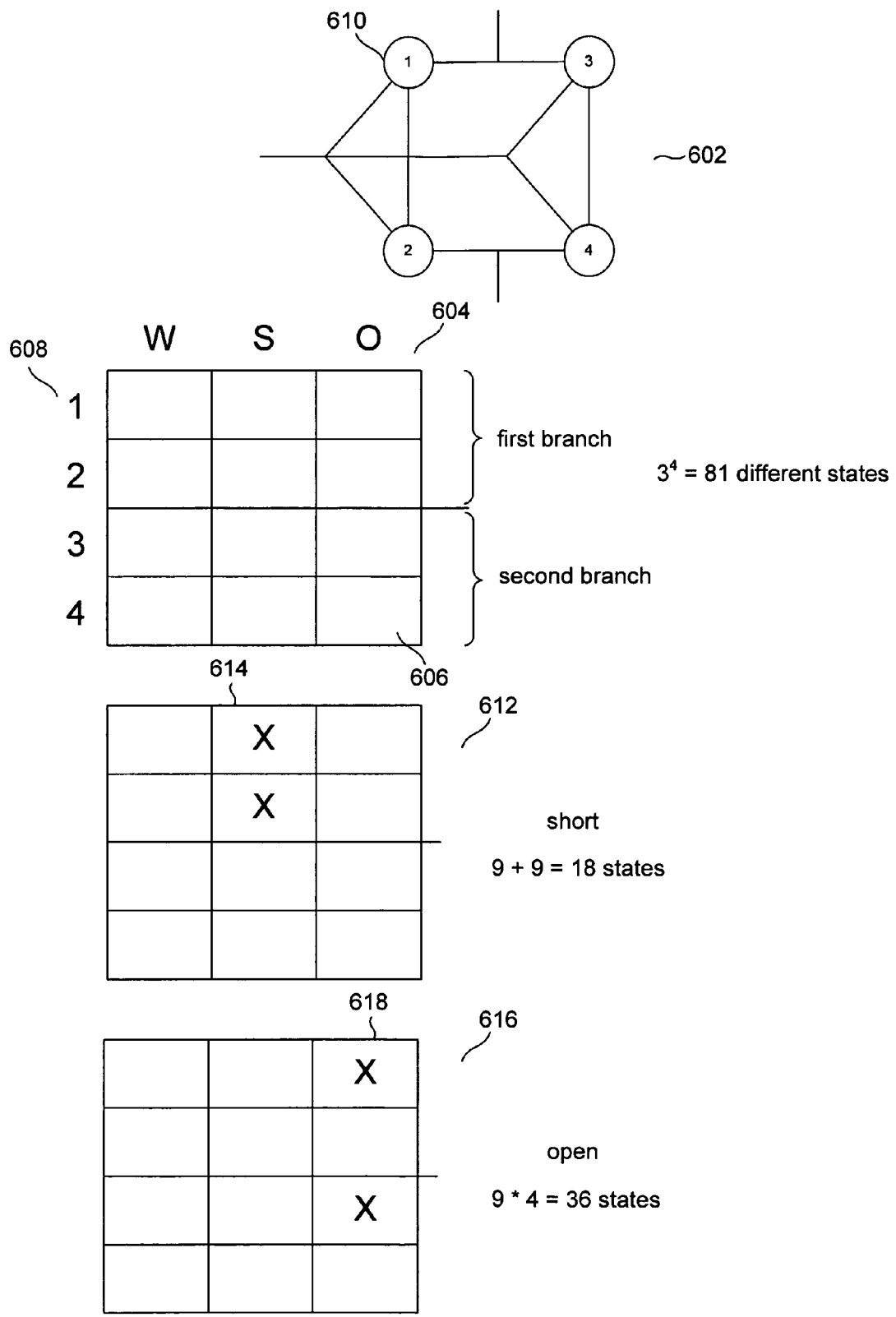
FIGS. 6 and 7 illustrate computation of the reliability of a 2S×2P compound transistor based on known rates of short defects and open defects within the single transistors that together compose the 2S×2P compound transistor according to one embodiment of the present invention.
Figure 7:
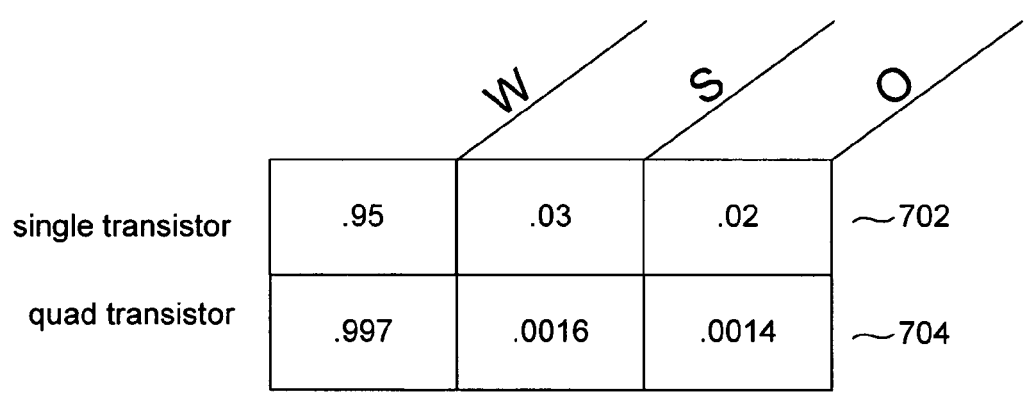

Using nS×mP compound transistors, rather than simple transistors, can lead to substantially increased defect-and-failure tolerance within a circuit. A compound transistor, by itself, has a reliability greater than the reliability of the individual, simple transistors of which it is composed. FIGS. 6 and 7 illustrate computation of the reliability of a 2S×2P compound transistor based on known rates of short defects and open defects within the single transistors that together compose the 2S×2P compound transistor according to one embodiment of the present invention. The functional state of a 2S×2P compound transistor 602 can be viewed as one of a number of different two-dimensional binary patterns. Each binary pattern 604 representing a functional state of the 2S×2P compound transistor includes 12 cells, such as cell 606. Each cell is indexed by a transistor number, such as the number "1" 608 representing the first simple transistor 610 in the 2S×2P compound transistor, and a functional state selected from among the above-described functional states "W," "S," and "O." The binary-digit contents of a cell indicate whether or not the simple transistor corresponding to the cell currently has the state corresponding to the cell. In subsequent diagrams, the symbol "X" indicates that the corresponding transistor has the corresponding state, and no symbol shown in a cell indicates that the corresponding transistor does not have the corresponding state. Since each of the four transistors can occupy one of three states, there are 81 different binary patterns that describe all of the possible functional states of the 2S×2P compound transistor.

Two types of patterns within a functional-state-representing binary pattern represent defective 2S×2P compound transistors. The first type of pattern 612 includes two short-defective transistors within the same branch of the 2S×2P compound transistor, with the first two rows of the binary pattern representing a first branch and the second two rows in the binary pattern representing a second branch. These patterns include two adjacent "X" symbols in the short-defective column 614, either in the first two rows of the pattern or the second two rows of the pattern. The other two transistors may have any of the three states, "W," "S," and "O." Thus, there are 18 different states, or binary patterns, that represent short-defective 2S×2P compound transistors. A second type of binary pattern 616 represents an open-defective 2S×2P compound transistor. In these patterns, at least one "X" symbol occurs in the open-defective column 618 in each branch. In other words, the 2S×2P compound transistor is open defective when at least the following pairs of transistors are open-defective: (1,3), (1,4), (2,3), and (2,4). There are 36 binary patterns, or functional states, that represent open-defective 2S×2P compound transistors. By computing the probabilities of each of the different, 81 functional states, or binary patterns, for a 2S×2P compound transistor based on the known defect rates of the single, simple transistors incorporated within the compound transistor, assuming transistor failures to be independent events, the statistical failure or defect rate for a compound transistor can be computed.

FIG. 7 shows a table showing the defect rate for a single transistor and for a 2S×2P compound transistor that incorporates four single transistors according to one embodiment of the present invention. The working and defect probabilities of a single transistor are shown in the first row 702 of the table, and the computed probabilities for 2S×2P compound transistor defects are shown in the second row 704 of the table. When the single transistor has an overall 95% probability of being functional, a 3% probability of being short-defective, and a 2% probability of being open-defective, the 2S×2P compound transistor has an overall 99.7% probability of being functional. The difference between a defect-free probability of 95% and 99.7% can lead to an enormous difference in yield of functional circuits made up of multiple single transistors and 2S×2P compound transistors. For example, in a 10-transistor circuit using simple transistors, a 95% probability for each transistor being defect free yields a 60% probability of the circuit being defect free, while the same device fabricated from 10 compound-transistors, each with a 99.7% probability of being defect free, yields a 97% probability for the circuit being defect free. In actual devices manufactured by current fabrication techniques, transistors are fabricated with much higher defect-free probabilities.

Figure 8:
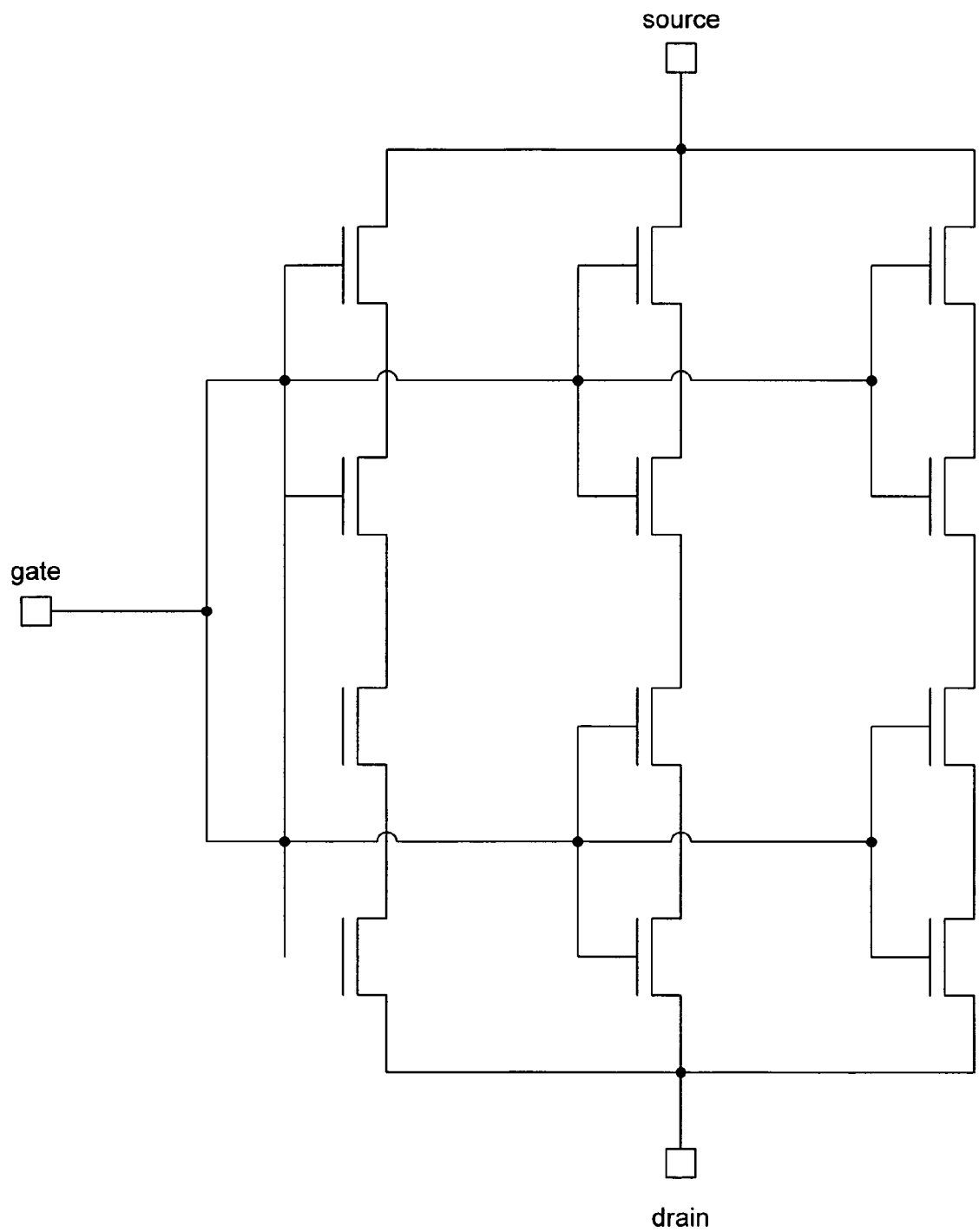
FIG. 8 shows a 12-transistor reversibly switchable element comprising three parallel branches, each branch composed of four serially linked simple transistors according to one embodiment of the present invention.

Even greater defect tolerance can be achieved by higher-order multi-transistor reversibly switchable elements, such as nS×mP compound transistors with n>2 and m>2. For example, FIG. 8 shows a 12-transistor reversibly switchable element comprising three parallel branches, each composed of four serially connected simple transistors, or, in other words, a 4S×3P transistor, according to one embodiment of the present invention. This 12-transistor reversibly switchable element, or 4S×3P transistor, can tolerate three short-defective transistors within a single branch, and can tolerate two open-defective parallel branches. A higher-order reversibly switchable element, such as an nS×mP compound transistor, can be composed of arbitrarily many branches m, each composed of an arbitrary number of serially linked simple transistors n. However, as the number of simple transistors included within an nS×mP compound transistor increases, the number of simple transistors within a failure-tolerant circuit or device rapidly increases, correspondingly rapidly increasing both the manufacturing cost and, in certain cases, the power consumption.

Figure 9A:
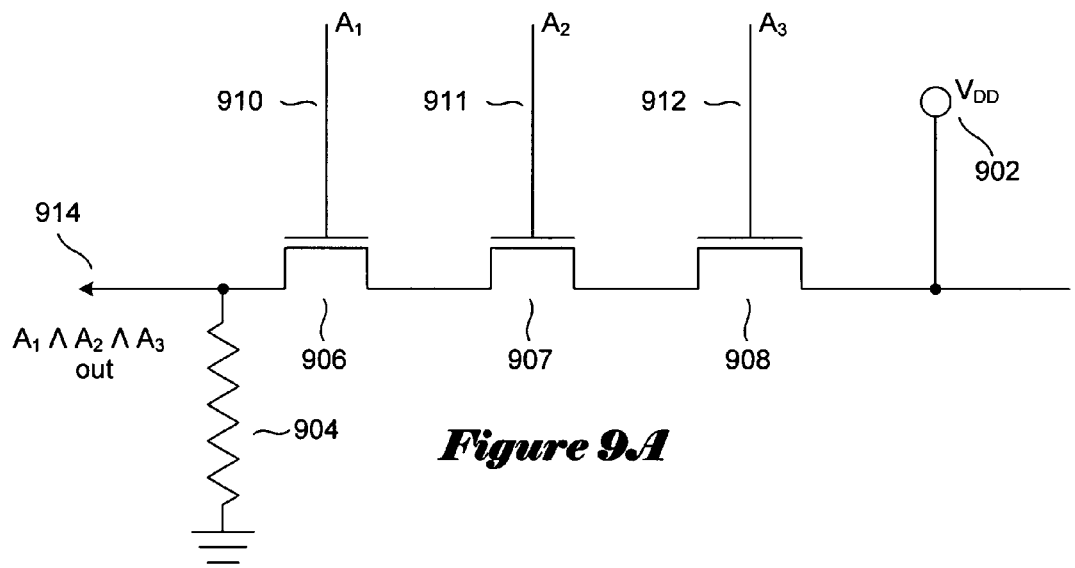
FIGS. 9A-B show two different types of AND gates.
Figure 9B:
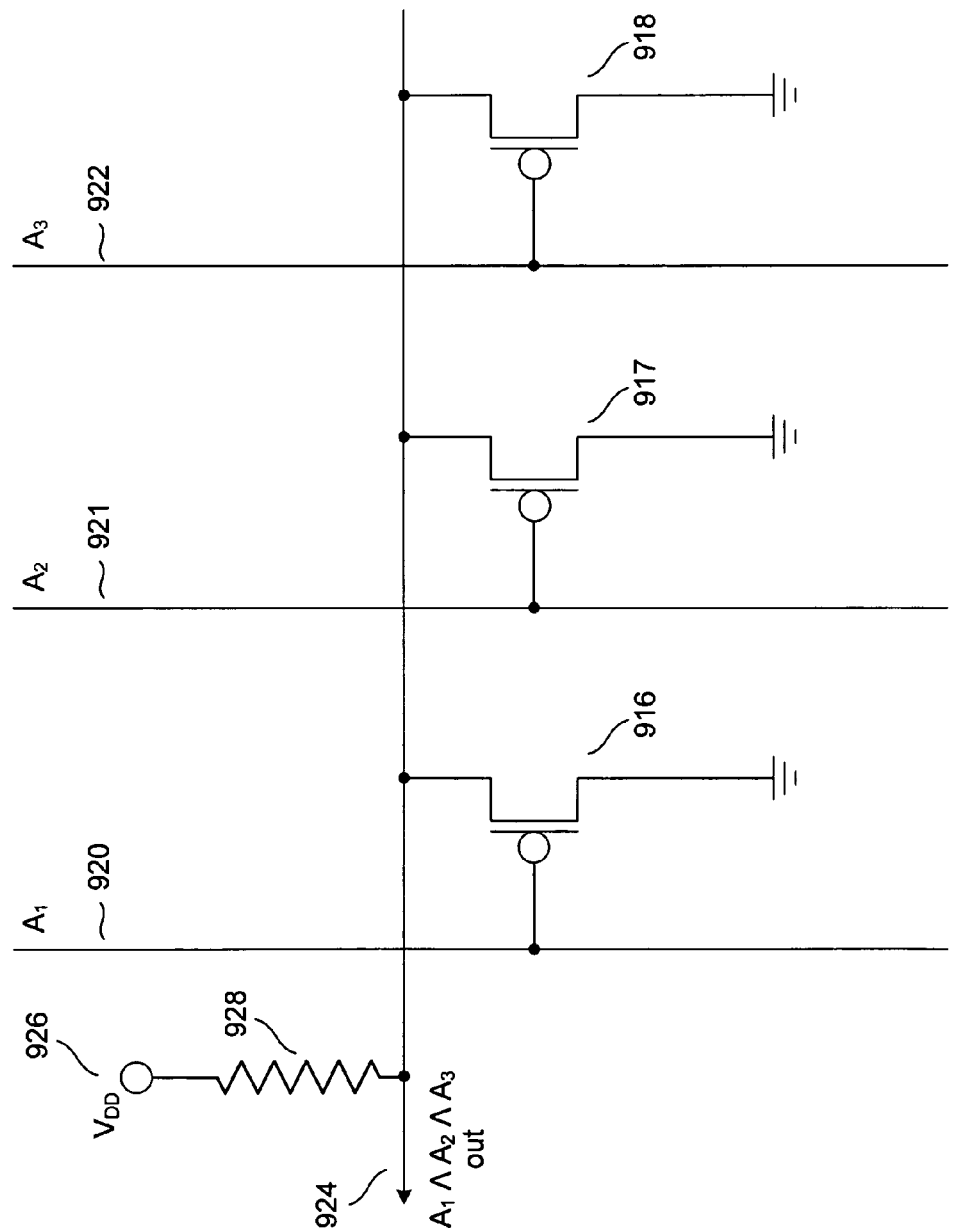

FIGS. 9A-B show two different types of AND gates. FIG. 9 shows a serial AND gate with a voltage source $V_{DD}$ 902 and a pull-down resistor 904. Three NMOS transistors 906-908 are serially linked together. Three address lines $A_1$, $A_2$, and $A_3$ 910-912 are input to the gates of transistors 906-908, respectively. The output signal line 914 of the AND gate carries a voltage signal representing the three-way AND of the logic states of the three address lines $A_1$, $A_2$, and $A_3$. When all three address lines have logic state "1," then, as shown in FIG. 2, all three NMOS transistors 906-908 are closed, connecting the output signal line 914 with the voltage source 902. Otherwise, when even a single of the address lines has logic state "0," the output signal line 914 is disconnected from the voltage source 902, and has 0 voltage, being connected to ground through the pull-down resistor 904. FIG. 9B shows a parallel AND gate employing PMOS transistors. As in the serial AND gate, the gates of PMOS transistors 916-918 are connected to address lines $A_1$ 920, $A_2$ 921, and $A_3$ 922, respectively. When all of the address lines are in logic state "1," all of the PMOS transistors are open, as shown in FIG. 2, so that the output signal line 924 is not connected to ground, but only to the voltage source 926 through pull-up resistor 928. If even one of the address lines is in logic state "0," then the output signal line 924 is connected to ground, and has logic state "0."

Figure 10:
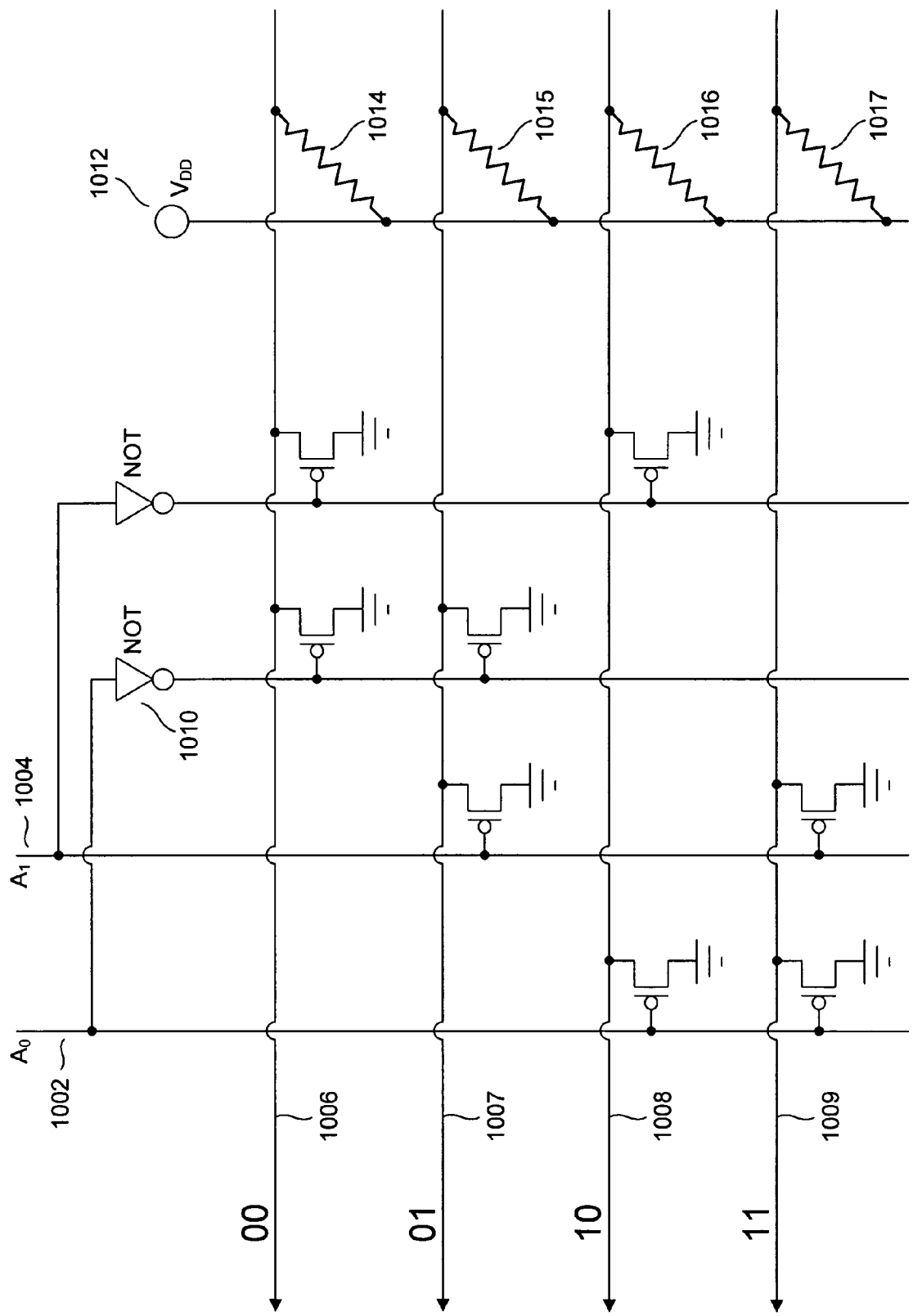
FIG. 10 shows a simple, two-address-line demultiplexer based on parallel PMOS-transistor-based AND gates.

FIG. 10 shows a simple, two-address-line demultiplexer based on parallel PMOS-transistor-based AND gates. A two-bit address input to address lines $A_0$ 1002 and $A_1$ 1004 sets one of the four output signal lines 1006-1009 to logic state "1," while the remaining output signal lines are set to logic state "0." Thus, the demultiplexer allows each output signal line to be addressed, or set to logic state "1," by a unique 2-bit address. In alternative implementations, the addressed output signal line may be set to logic state "0," while all other output signal lines are set to logic state "1." In general, a demultiplexer selects the output signal line corresponding to, or associated with, an input address, where selection generally means that the selected output signal line is set to desired logic state. Note that each address line is divided into an internal signal line carrying the same logic states as the address line and an internal signal line carrying a logic state complementary to that of the address line, the logic state of the complementary internal signal line set via a NOT gate, such as NOT gate 1010. Each output signal line is connected to a voltage source 1012 through a pull-up resistor 1004-1017.

Figure 11:
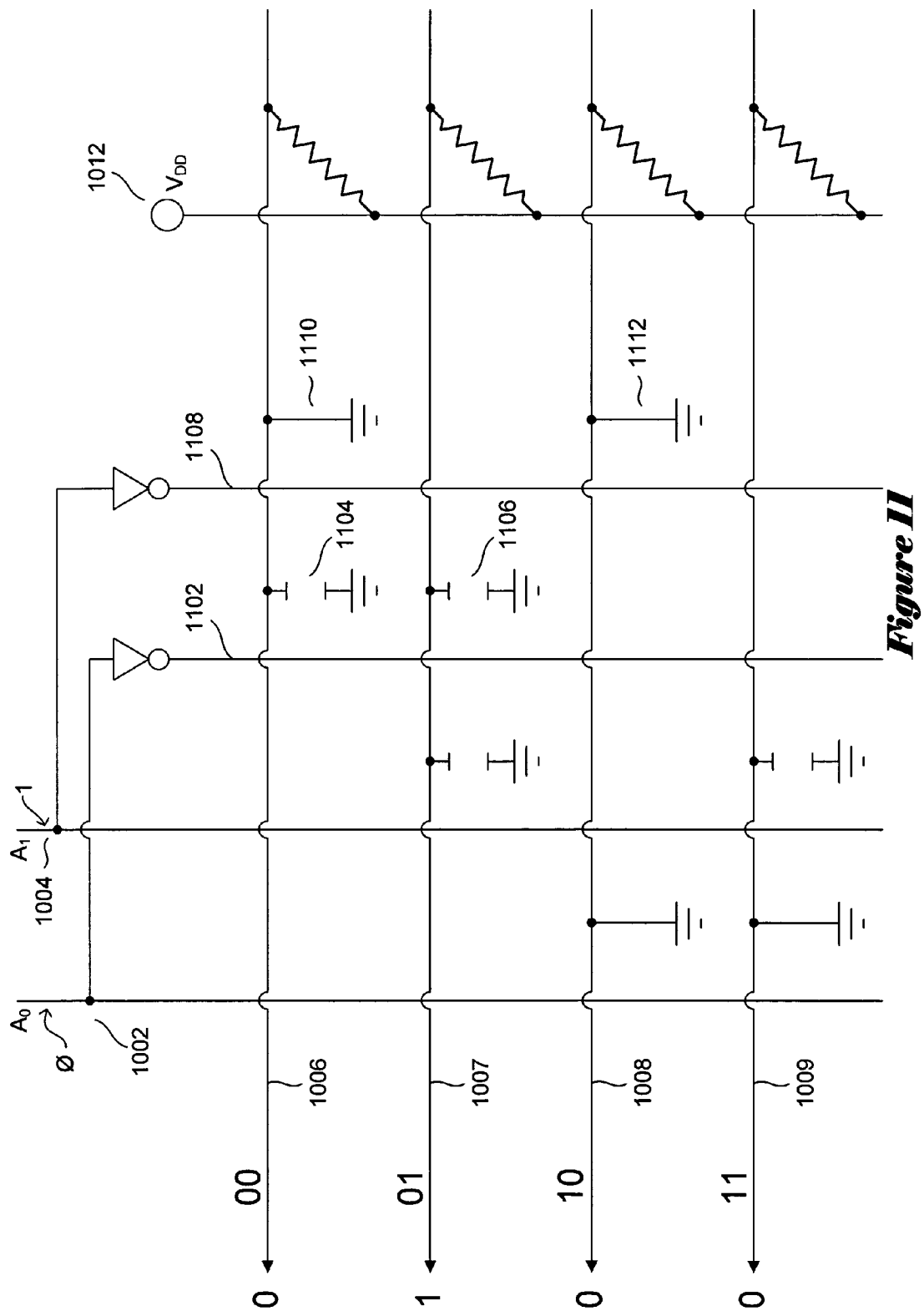
FIG. 11 illustrates operation of the PMOS-transistor-based demultiplexer shown in FIG. 10.

FIG. 11 illustrates operation of the PMOS-transistor-based demultiplexer shown in FIG. 10. In FIG. 11, the address "01" is input to address lines 1002 and 1004. This input address results in the pattern of open and closed transistors shown in FIG. 11. For example, the "0" logic state of address line $A_0$ results in a logic state "1" on complementary signal line 1102 which, in turn, opens PMOS transistors 1104 and 1106. Conversely, logic state "1" input to address line $A_1$ 1004 results in a logic state "0" on complementary signal line 1108, which in turn closes PMOS transistors 1110 and 1112. Output signal line 1007, corresponding to the input address "01," is not connected to ground, and therefore essentially reflects the voltage of voltage source 1012. All of the other output signal lines 1006 and 1008-1009 are connected to ground through one PMOS transistor, and therefore have logic state "0."

FIGS. 12A-D illustrate the functional state of the PMOS-transistor-based demultiplexer shown in FIGS. 10-11 when all component PMOS transistors are functional and when certain of the component PMOS transistors are defective. In FIGS. 12A-D, and in subsequent, similar figures, each transistor is represented by a circle, such as circle 1202, within a two-dimensional matrix, each cell of which represents each possible interconnection between address lines, and complementary signal lines derived from the address lines, and output signal lines. A filled circle indicates an open transistor, and an unfilled circle represents a closed transistor. An open circle labeled with the character "S" indicates a short-defective transistor, and a matrix cell completely darkened, such as matrix cell 1204, indicates an open-defective transistor. FIG. 12A shows a fully functional demultiplexer with input address "01," as in FIG. 11. Four PMOS transistors are open 1206-1209 and four PMOS transistors are closed 1202 and 1210-1212. The output signal line with address "01" has logic state "1" 1214, and the remaining output signal lines have logic state "0." FIG. 12B shows the demultiplexer with an open-defective PMOS transistor 1204. Address "01" is input to the demultiplexer in FIG. 12B. Because of the open-defective transistor 1204, two output signal lines 1214 and 1216 have logic state "1." Thus, the demultiplexer is defective, since only a single output signal line corresponding to the input address has logic state "1" in a properly functioning demultiplexer. Similarly, FIG. 12C shows the functional state of the demultiplexer when a PMOS transistor 1218 is short-defective. In this case, when address "01" is input to the demultiplexer, no output signal line has logic state "1." Thus, the demultiplexer shown in FIG. 12C is defective. As shown in FIG. 12D, a defective demultiplexer may still provide correct output for certain input signals. In FIG. 12D, the address "00" is input to the defective demultiplexer first shown in FIG. 12C, leading to the correct logic state of the output signal lines. The PMOS-transistor-based demultiplexer shown in FIG. 10 cannot therefore tolerate even a single defective transistor. The PMOS-transistor-based demultiplexer of FIGS. 10-11 is not defect-and-failure tolerant.

Figure 13:
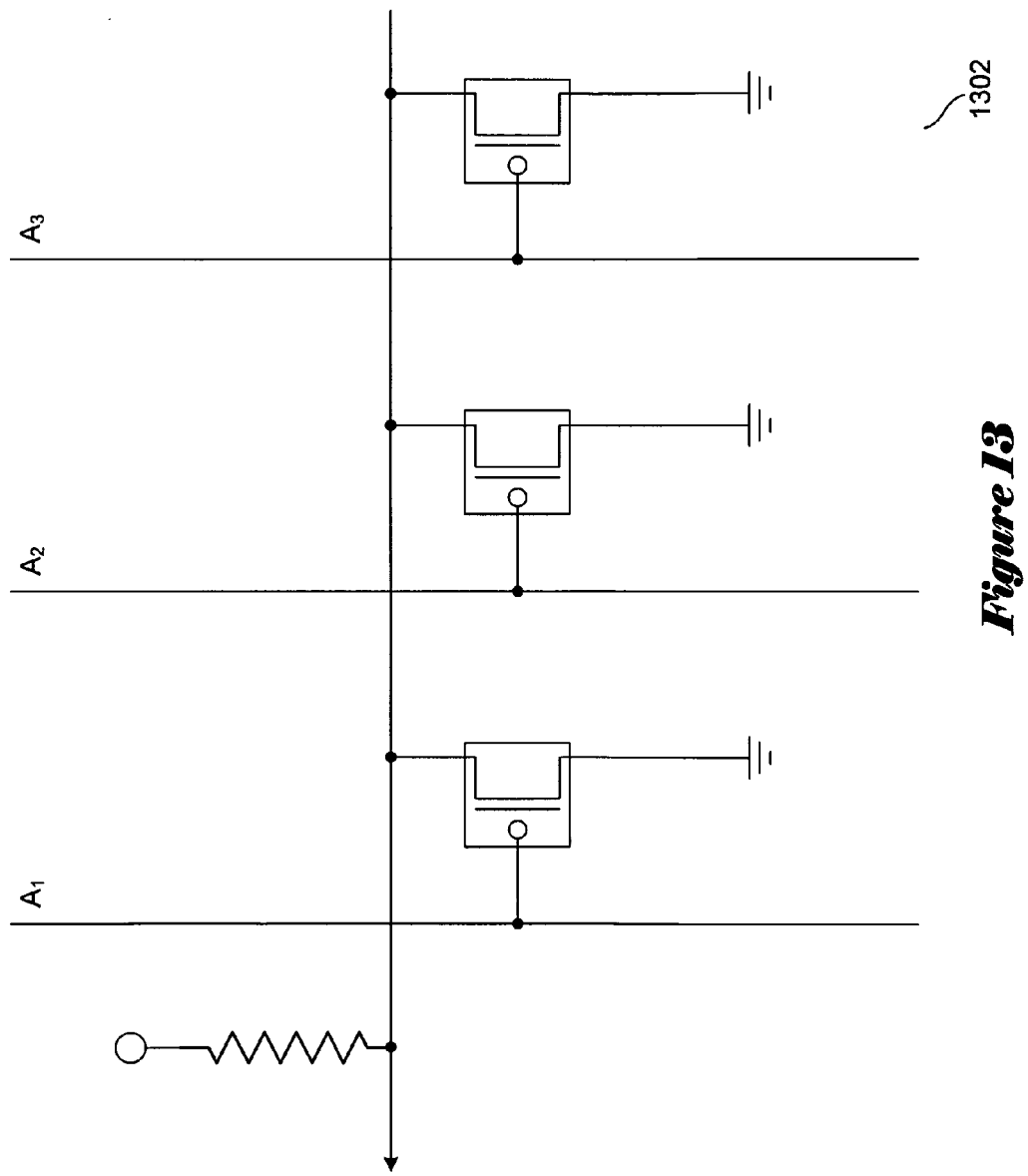
FIGS. 13-14 illustrate one approach to creating a defect-and-failure-tolerant demultiplexer that represents one embodiment of the present invention.
Figure 14:
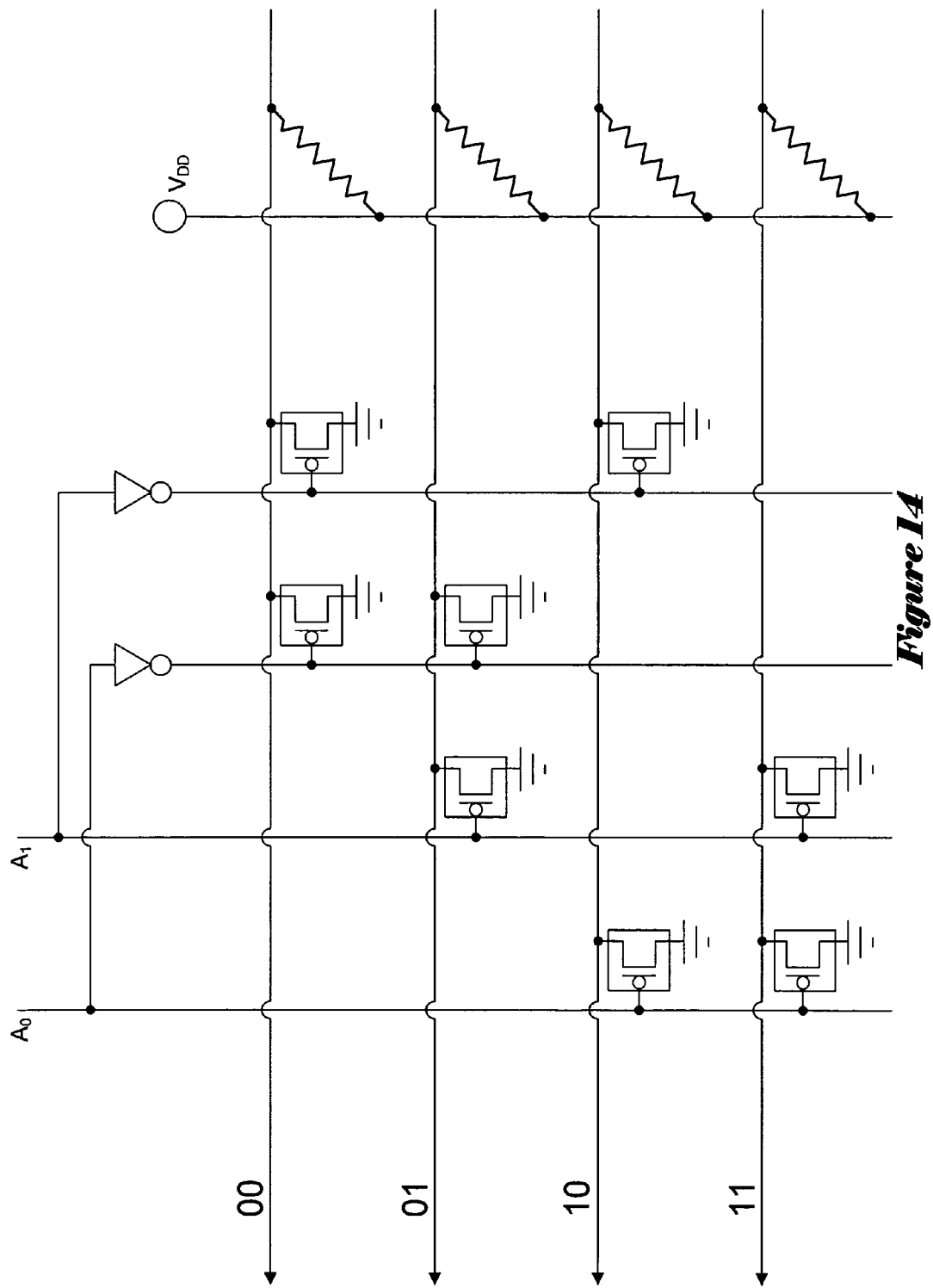

FIGS. 13-14 illustrate one approach to creating a defect-and-failure-tolerant demultiplexer that represents one embodiment of the present invention. A defect-and-failure-tolerant parallel AND gate can be created by using 2S×2P compound PMOS transistors in place of simple, PMOS transistors. The defect-and-failure-tolerant, compound-PMOS-transistor-based parallel AND gate 1302 shown in FIG. 13 can tolerate various patterns of open-defective and short-defective component transistors, as discussed above with reference to FIG. 6-7. As shown in FIG. 14, a defect-and-failure-tolerant demultiplexer equivalent to the demultiplexer shown in FIGS. 10-11 can be constructed from four 2S×2P compound-PMOS-transistor-based parallel AND gates. Although this demultiplexer is defect-and-failure-tolerant, the defect tolerance is achieved at the expense of a four-fold increase in the number of transistors, which may, in certain cases, lead to an increase in the area of the demultiplexer, an increase in the manufacturing costs of the demultiplexer, and an increase in power consumption of the demultiplexer.

Figure 15:
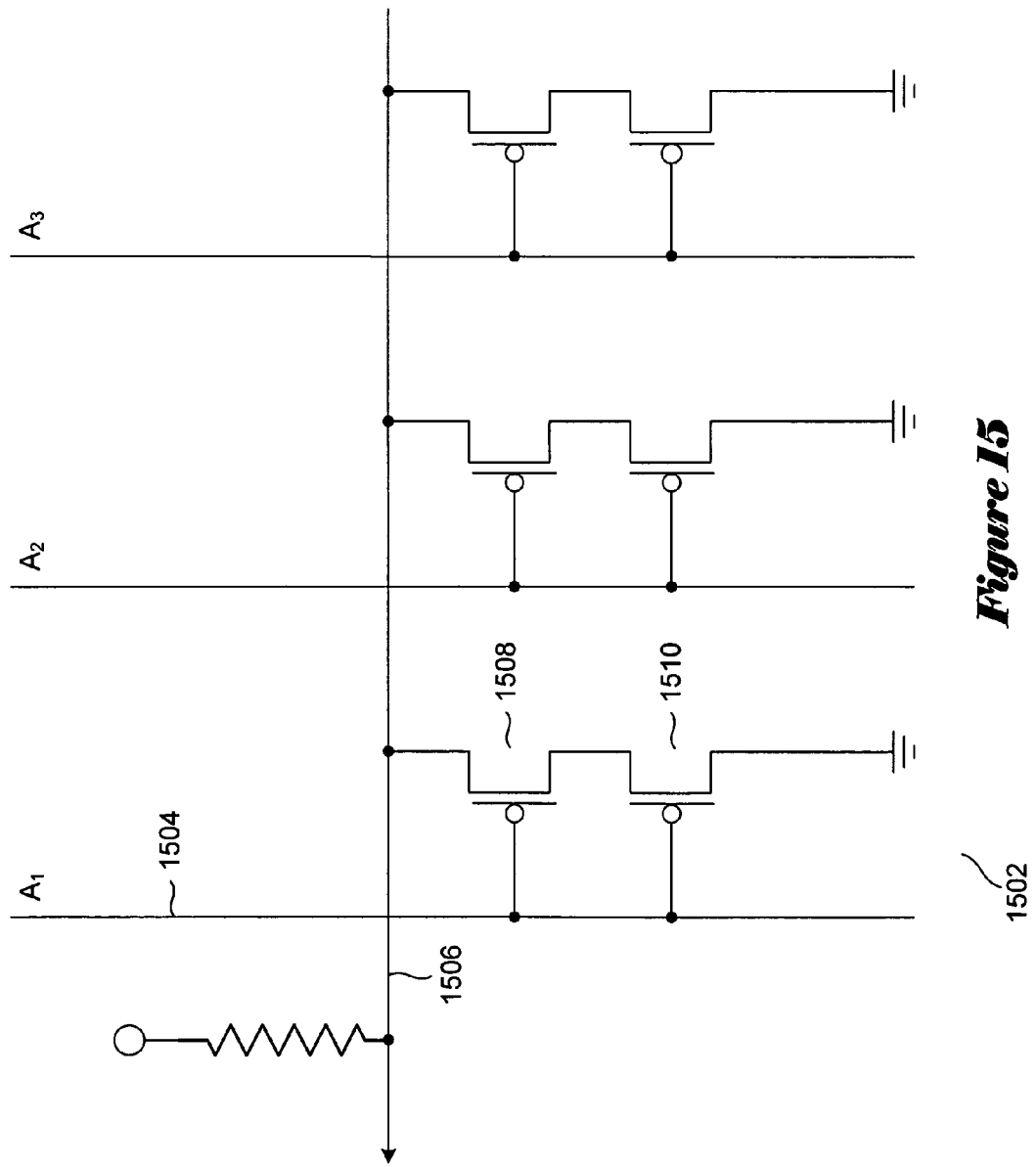
FIGS. 15-16 illustrate a defect-and-failure-tolerant demultiplexer, equivalent to the demultiplexers shown in FIGS. 10-11 and 14, which represents one embodiment of the present invention.
Figure 16:
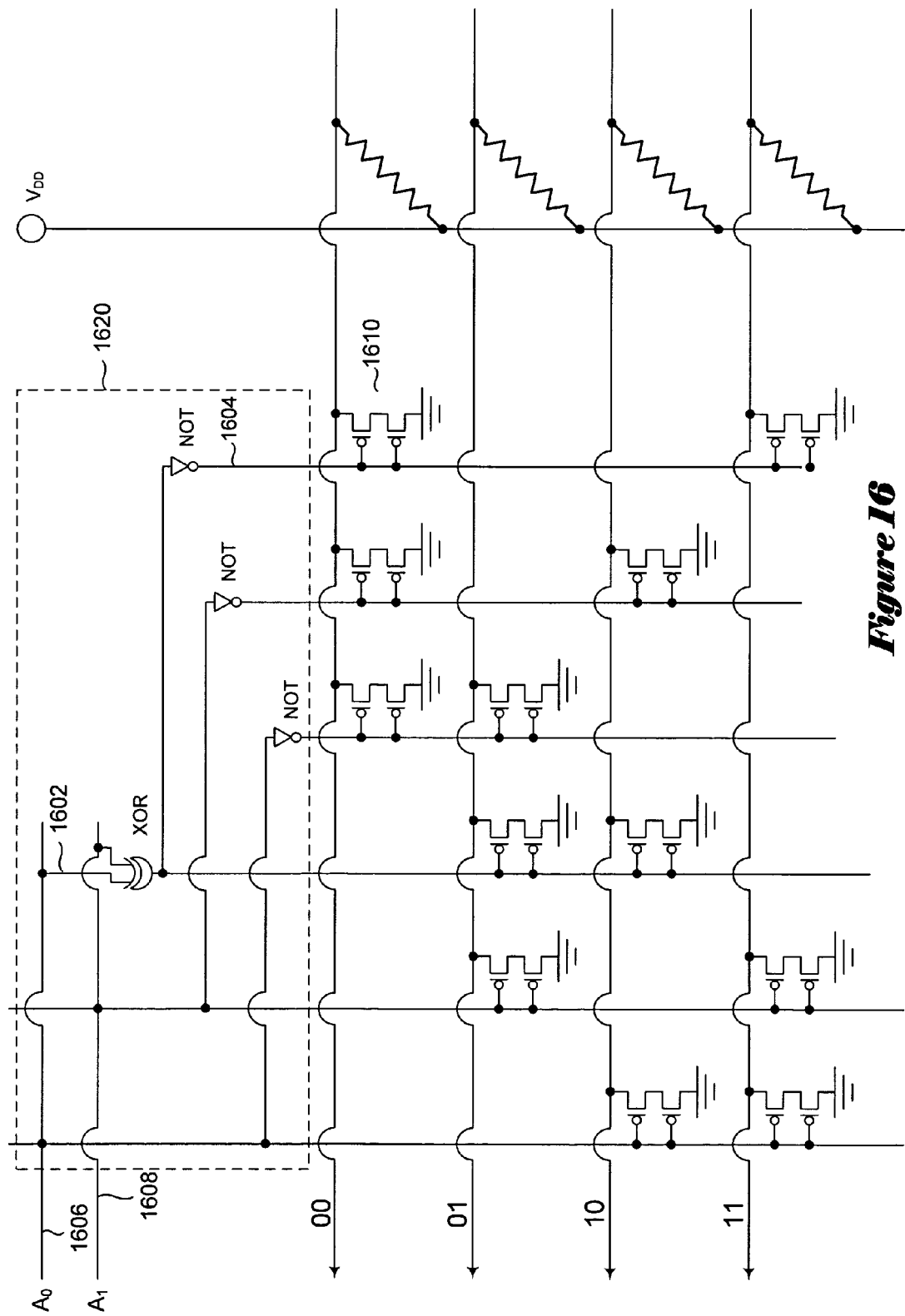

FIGS. 15-16 illustrate a defect-and-failure-tolerant demultiplexer, equivalent to the demultiplexers shown in FIGS. 10-11 and 14, which represents one embodiment of the present invention. FIG. 15 shows a parallel AND gate with serially redundant PMOS transistors that is tolerant to short defects. The parallel AND gate in FIG. 15 is logically equivalent to the parallel AND gates shown in FIGS. 9B and 13. However, the short-defect-tolerant parallel AND gate 1502 shown in FIG. 15 interconnects each address line with the output signal line via two serially linked PMOS transistors. For example, address line $A_1$ 1504 is interconnected to the output signal line 1506 via the two serially linked PMOS transistors 1508 and 1510. The serially redundant PMOS-transistor-based AND gate 1502 can tolerate a single short-defective PMOS transistor in each two-PMOS-transistor-based reversibly switchable interconnection linking an address line to the output signal line. According to the above-discussed terminology for compound transistors, each pair of serially linked PMOS transistors in the defect-and-failure-tolerant demultiplexer of FIG. 15 can be considered to be an 2S×0P compound transistor.

FIG. 16 shows a demultiplexer logically equivalent to the demultiplexers shown in FIGS. 10-11 and 14 that represents one embodiment of the present invention. This demultiplexer is composed of four serially redundant AND gates, such as the serially redundant AND gate shown in FIG. 15. Unlike the previously discussed multiplexors, the demultiplexer that represents one embodiment of the present invention, as shown in FIG. 16, includes two internal supplemental signal lines 1602 and 1604. The first internal supplemental signal line represents the logical XOR of address lines $A_0$ 1606 and $A_1$ 1608. A second, supplemental signal line 1604 is complementary, in logic state, to the XOR supplemental signal line 1602. These two supplemental signal lines represent increased redundancy within the demultiplexer, which allows for an additional reversibly switchable element in each of the AND gates. In general, a linear-block code or other error-control coding technique is used to determine the pattern of interconnections between supplemental signal lines and output signal lines, these supplemental interconnections corresponding to the redundant code symbols used in linear-block codes and other error-control codes, in order to ensure a correct Hamming distance between adjacent coded addresses so that the maximum number of open defects, d−1, can be tolerated. In general, encoder circuitry, such as the encoder circuitry enclosed in dashed rectangle 1620 in FIG. 16, is needed to encode each input k-bit address into an n-bit internal, coded address according to an [n, k, d] linear-block code, as discussed in the previous subsection. Other types of encoders may be needed for other types of error-control codes. Comparing the demultiplexer shown in FIG. 10 with the demultiplexer shown in FIG. 16 that represents one embodiment of the present invention, the switchable element 1610 in the demultiplexer of FIG. 16 can be observed to be newly added with respect to the demultiplexer shown in FIG. 10. These newly added reversibly switchable elements, made possible by the additional, redundant vertical signal lines, provide defect tolerance for open-defective transistors.

Figure 17A:
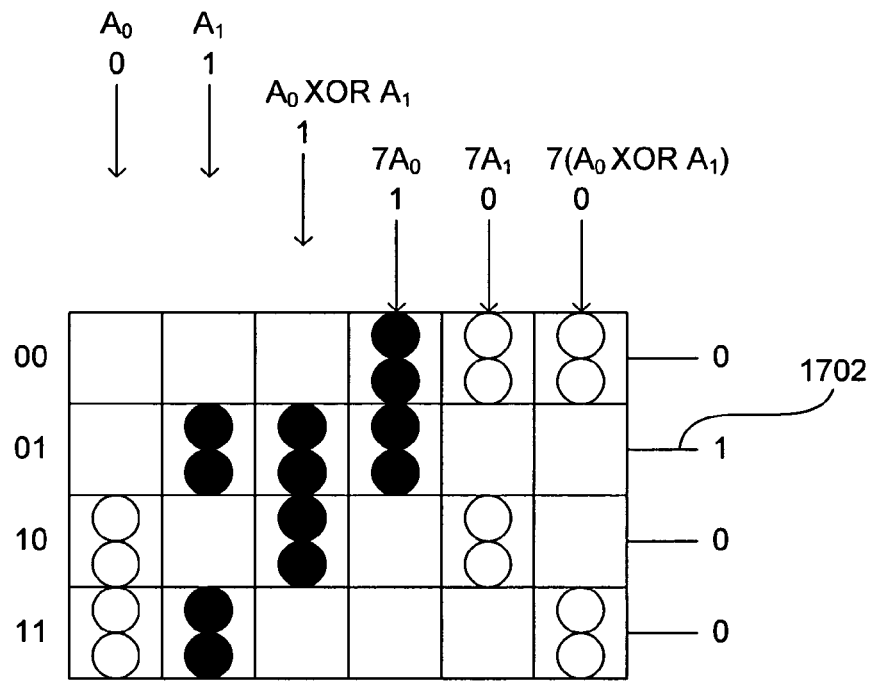
FIGS. 17A-H illustrate, using the same illustration conventions as employed in FIGS. 12A-D, various functional states of the demultiplexer shown in FIG. 16 that represents one embodiment of the present invention.
Figure 17B:
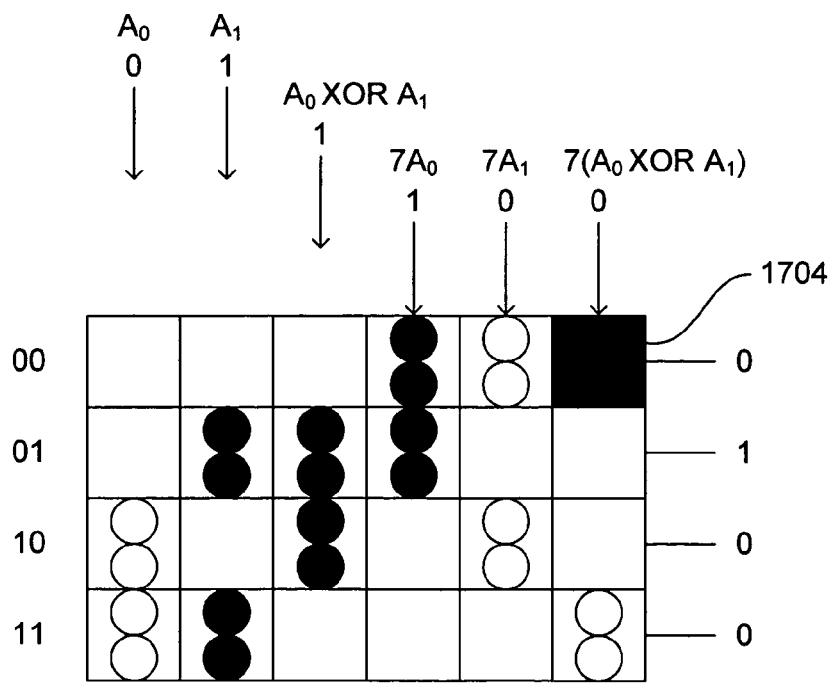
Figure 17C:
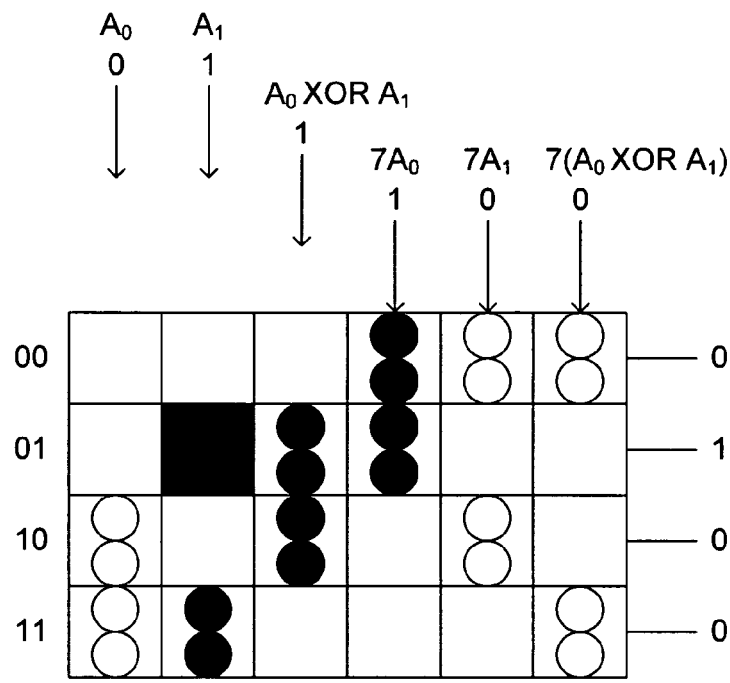
Figure 17D:
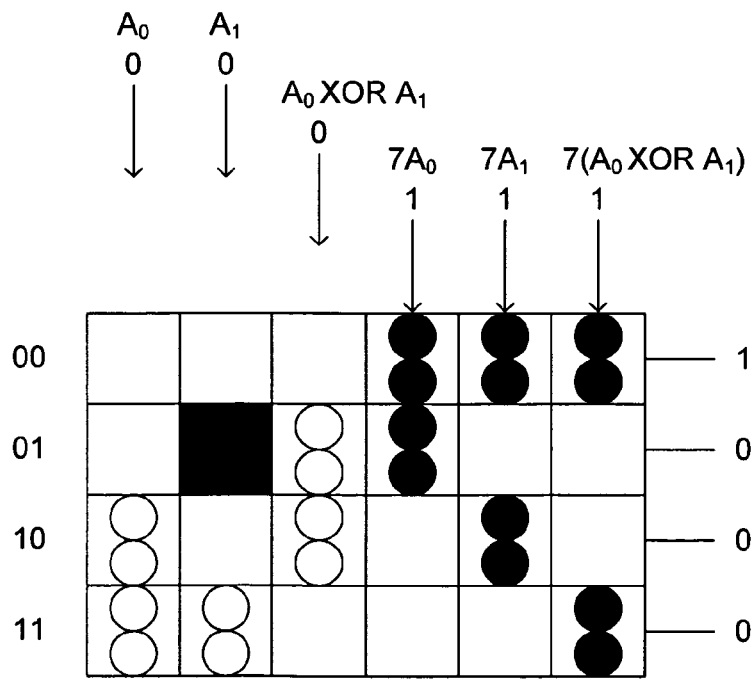
Figure 17E:
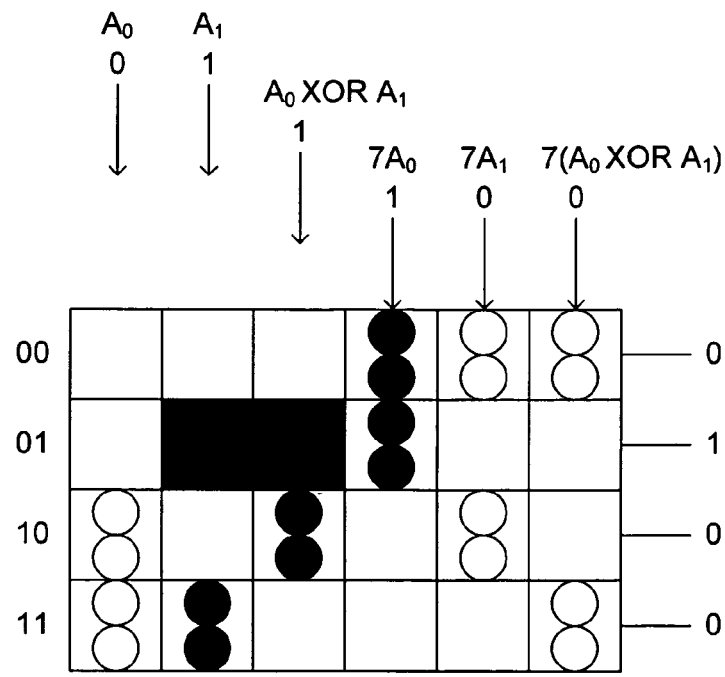
Figure 17F:
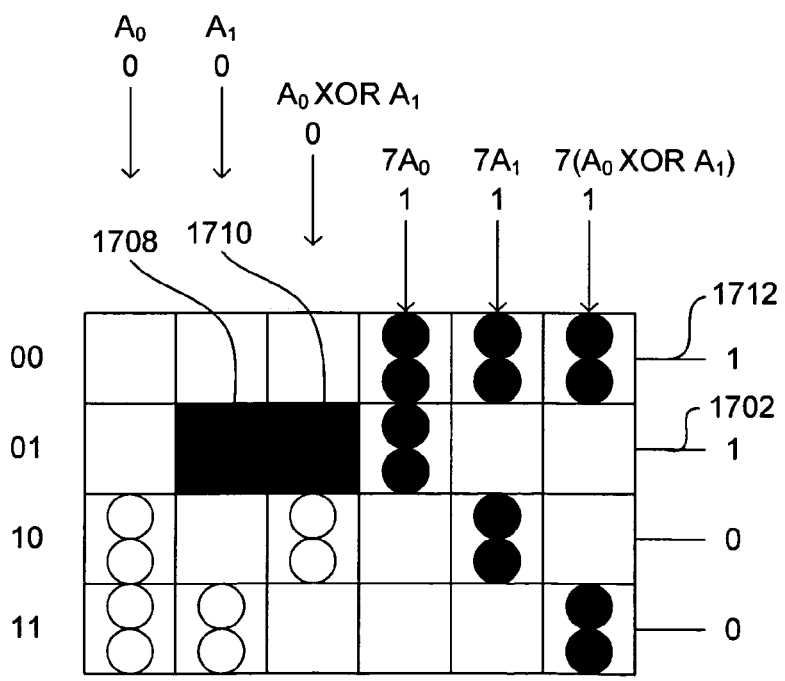
Figure 17G:
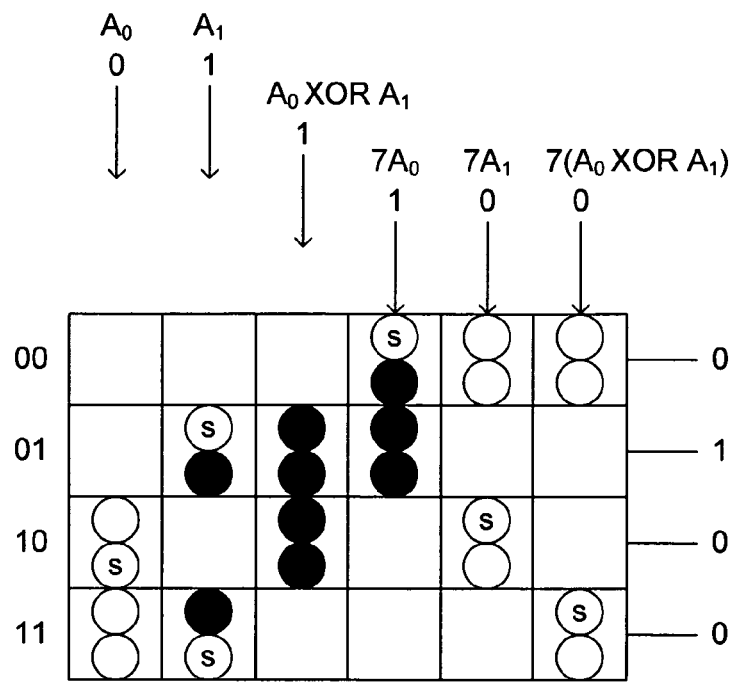
Figure 17H:
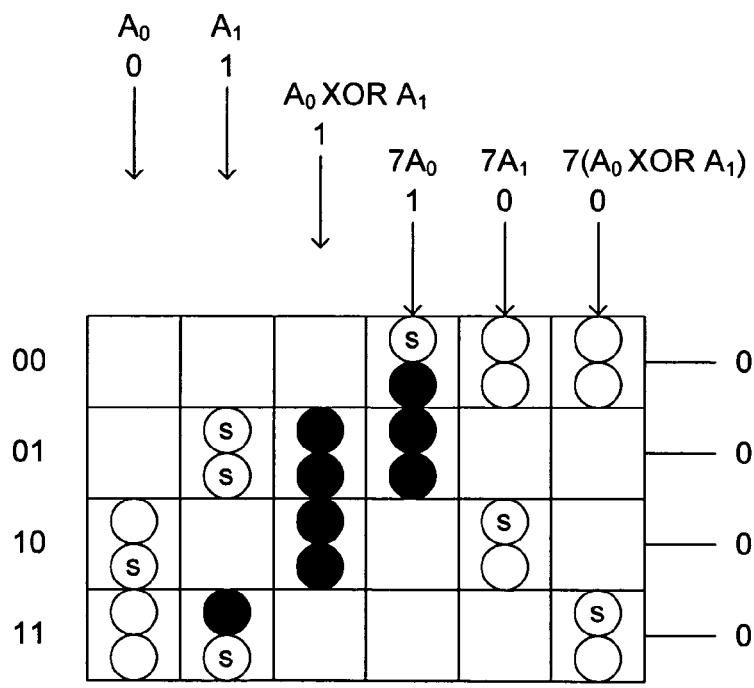

FIGS. 17A-H illustrate, using the same illustration conventions as employed in FIGS. 12A-D, various functional states of the demultiplexer shown in FIG. 16. FIG. 17A shows a fully functional demultiplexer to which the address "01" is input. As it should, the output signal line 1702 associated with address "01" has logic state "1," while the remaining output signal lines have logic states "0." FIG. 17B shows the functional state of the demultiplexer with an open-defective switchable element 1704. When address "01" is input to the demultiplexer with the open-defective switchable element, the demultiplexer continues to function normally. FIGS. 17C and 17D show that the demultiplexer that represents one embodiment of the present invention tolerates a single open-defective switchable element. However, as shown in FIGS. 17E-F, two open-defective switchable elements lead to a non-functional device. As shown in FIG. 17F, when the address "00" is input to the demultiplexer with two open-defective switchable elements 1708 and 1710, two output signal lines 1702 and 1712 have logic state "1." Similarly, FIGS. 17G and 17H show that the demultiplexer that represents one embodiment of the present invention can tolerate a single short-defective transistor in each switchable element, but fails when two short-defective transistors occur in single switchable element.

Although the present invention has been described in terms of particular embodiments, it is not intended that the invention be limited to these embodiments. Modifications within the spirit of the invention will be apparent to those skilled in the art. For example, a wide variety of combinations of multi-transistor reversibly switchable interconnections, such as nS×mP transistors, and supplemental internal signal lines can be used to create defect-and-failure tolerant demultiplexers according to various methods of the present invention. Compound nS×mP transistors or higher-order nS×mP transistors can be used without additional internal signal lines to create defect-and-failure tolerant demultiplexers. Alternatively, serially-redundant reversibly switchable interconnections, such as nS×0P transistors, can be used for tolerating short-defective transistors along with supplemental signal lines introduced according to a linear-block code or other error-control code to tolerate open-defective transistors. In addition, rectangular higher-order multi-transistor reversibly switchable interconnections, such as nS×0P transistors, with higher serial n than parallel m redundancy, can be used in combination with supplemental signal lines introduced according to a linear-block code or other error-control code. When analyzed for cost-effectiveness, complexity, and other such metrics and parameters, use of serially-redundant reversibly switchable interconnections for tolerating short-defective transistors along with supplemental signal lines introduced according to a linear-block code or other error-control code to tolerate open-defective transistors appears to be more cost effective and less complex than using compound or higher-order multi-transistor reversibly switchable interconnections with both serial and parallel redundancies, although the optimal approach for designing defect-and-failure-tolerant demultiplexers may be application dependent. In the above-described embodiments, a small, 2-bit-addressable demultiplexer is described, but embodiments of the present invention include demultiplexers with an arbitrary number of address lines, or address bits, k, and as many as $2^k$ output signal lines. Moreover, a wide variety of ranges of failure-and-defect tolerance can be embodied in demultiplexers of the present invention, including use of an essentially arbitrary number of supplemental internal signal lines and higher-order multi-transistor interconnections with arbitrary levels of serial and parallel redundancies.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A defect-and-failure tolerant demultiplexer comprising:
a number of address lines that receive input addresses;
a number of output signal lines, each corresponding to an address;
a number of signal lines complementary to the number of address lines; and
a number defect-tolerant reversibly switchable interconnections that interconnect address lines and complementary signal lines to the output signal lines so that the output signal line corresponding to an input address is selected by the demultiplexer.

2. The defect-and-failure tolerant demultiplexer of claim 1 wherein the defect-tolerant reversibly switchable interconnections include serially redundant transistors in each of a number of parallel, redundant branches.

3. The defect-and-failure tolerant demultiplexer of claim 2 wherein the defect-tolerant reversibly switchable interconnections are 2S×2P compound transistors.

4. The defect-and-failure tolerant demultiplexer of claim 2 wherein the defect-tolerant reversibly switchable interconnections are higher-order nS×mP transistors that are both short-defective-component-transistor tolerant and open-defective-component-transistor tolerant.

5. The defect-and-failure tolerant demultiplexer of claim 1 wherein the defect-tolerant reversibly switchable interconnections include a number n of serially redundant transistors in each of a number m branches, wherein n is greater than m, wherein n is greater than or equal to 2, and wherein m is greater than or equal to 1.

6. The defect-and-failure tolerant demultiplexer of claim 5 further including:
supplemental signal lines and supplemental complementary signal lines and additional reversibly switchable interconnections;
an encoder circuit that generates an internal, coded address from an input address;
reversibly switchable interconnections that interconnect the supplemental signal lines and supplemental complementary signal lines to the output signal lines so that the output signal line corresponding to an internal, coded address is selected by the demultiplexer.

7. The defect-and-failure tolerant demultiplexer of claim 6 wherein the encoder circuit generates an internal, coded address from an input address according to an [n', k, d] linear block code and wherein the defect-and-failure tolerant demultiplexer tolerates d−1 open-defective reversibly switchable interconnections connected to each output signal line and tolerates shorts in one less than the number of serially linked transistors in each reversibly switchable interconnection.

8. A method for fabricating a defect-and-failure tolerant demultiplexer, the method comprising:
selecting an address size k;
selecting a number of output signal lines m' equal to or less than $2^k$; and
fabricating the defect-and-failure tolerant demultiplexer to include
k address lines that receive input addresses;
m' output signal lines, each corresponding to a k-bit address;
k signal lines complementary to the number of address lines; and
a number defect-tolerant reversibly switchable interconnections that interconnect address lines and complementary signal lines to the output signal lines so that the output signal line corresponding to an input address is selected by the demultiplexer.

9. The method of claim 8 further including fabricating defect-tolerant reversibly switchable interconnections that include serially redundant transistors in each of a number of parallel, redundant branches.

10. The method of claim 9 further including fabricating compound transistors as defect-tolerant reversibly switchable interconnections.

11. The method of claim 9 further including fabricating higher-order multi-transistor reversibly switchable interconnections that are both short-defective-component-transistor tolerant and open-defective-component-transistor tolerant as defect-tolerant reversibly switchable interconnections.

12. The method of claim 8 further including fabricating defect-tolerant reversibly switchable interconnections that each includes a number n of serially redundant transistors in each of a number m branches, wherein n is greater than m, wherein n is greater than or equal to 2, and wherein m is greater than or equal to 1.

13. The method of claim 12 further including:
fabricating supplemental signal lines and supplemental complementary signal lines;
fabricating an encoder circuit that generates an internal, coded address from an input address; and
fabricating additional reversibly switchable interconnections that interconnect the supplemental signal lines and supplemental complementary signal lines to the output signal lines so that the output signal line corresponding to an internal, coded address is selected by the demultiplexer.

14. The method of claim 13 wherein the encoder circuit generates an internal, coded address from an input address according to an [n', k, d] linear block code and wherein the defect-and-failure tolerant demultiplexer tolerates d−1 open-defective reversibly switchable interconnections connected to each output signal line and tolerates n−1 short-defective transistors in each reversibly switchable interconnection.

* * * * *